(12) United States Patent
Deguenther et al.

(10) Patent No.: US 10,444,631 B2
(45) Date of Patent: Oct. 15, 2019

(54) METHOD OF OPERATING A MICROLITHOGRAPHIC PROJECTION APPARATUS AND ILLUMINATION SYSTEM OF SUCH AN APPARATUS

(71) Applicant: Carl Zeiss SMT GmbH, Oberkochen (DE)

(72) Inventors: Markus Deguenther, Aalen (DE); Johannes Eisenmenger, Ulm (DE); Stefanie Hilt, Aalen (DE); Thomas Korb, Schwaebisch Gmuend (DE); Frank Schlesener, Oberkochen (DE); Manfred Maul, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/899,521

(22) Filed: Feb. 20, 2018

(65) Prior Publication Data

US 2018/0217506 A1    Aug. 2, 2018

Related U.S. Application Data

(63) Continuation of application No. PCT/EP2015/071826, filed on Sep. 23, 2015.

(51) Int. Cl.
*G03F 7/20* (2006.01)
*G02B 26/08* (2006.01)
*G02B 3/00* (2006.01)

(52) U.S. Cl.
CPC ........ *G03F 7/70116* (2013.01); *G02B 3/0062* (2013.01); *G02B 26/0833* (2013.01);
(Continued)

(58) Field of Classification Search
CPC ............ G03F 7/70791; G03F 7/70275; G03F 7/70116; G03F 7/70075; G03F 7/7085
(Continued)

(56) References Cited

U.S. PATENT DOCUMENTS 7,061,582 B2    6/2006 Zinn et al.
2005/0237375 A1   10/2005 Tokita et al.
(Continued)

FOREIGN PATENT DOCUMENTS

EP    1 262 836 A1    12/2002
JP    H07-220989 A    8/1995
(Continued)

OTHER PUBLICATIONS

The International Search Report and a Written Opinion from the counterpart PCT Application No. PCT/EP2015/071826, dated Jun. 13, 2016.
(Continued)

*Primary Examiner* — Hung Nguyen
(74) *Attorney, Agent, or Firm* — Fish & Richardson P.C.

(57) ABSTRACT

An illumination system of a microlithographic projection apparatus includes a spatial light modulator having a modulation surface including a plurality of micromirrors. Each micromirror includes a mirror surface having an orientation that can be changed individually for each micromirror. For at least one of the micromirrors, at least one parameter that is related to the mirror surface is measured. The orientation of the mirror surfaces is controlled depending on the at least one measured parameter. A light pattern is produced on the modulation surface, and an image of the light pattern is formed on an optical integrator that has a plurality of light entrance facets. Images of the light entrance facets are superimposed on a mask.

22 Claims, 14 Drawing Sheets

(52) U.S. Cl.
CPC .......... *G03F 7/702* (2013.01); *G03F 7/70075* (2013.01); *G03F 7/7085* (2013.01)

(58) Field of Classification Search
USPC .................................. 355/52, 53, 55, 67–71
See application file for complete search history.

(56) References Cited

U.S. PATENT DOCUMENTS

| | | | |
|---|---|---|---|
| 2006/0087634 A1 | 4/2006 | Brown et al. | |
| 2007/0296936 A1* | 12/2007 | Kato | G03F 7/70275 355/52 |
| 2009/0115990 A1 | 5/2009 | Owa et al. | |
| 2009/0116093 A1 | 5/2009 | Tanitsu | |
| 2009/0135392 A1 | 5/2009 | Muramatsu | |
| 2011/0181850 A1* | 7/2011 | Bach | G03F 7/70116 355/30 |
| 2014/0218703 A1* | 8/2014 | Mizuno | G03F 7/70116 355/67 |
| 2015/0146183 A1 | 5/2015 | Deguenther et al. | |
| 2017/0304947 A1* | 10/2017 | Shibazaki | B33Y 10/00 |

FOREIGN PATENT DOCUMENTS

| | | |
|---|---|---|
| JP | 2002-372790 A | 12/2002 |
| JP | 2005-311084 A | 11/2005 |
| JP | 2009-117671 A | 5/2009 |
| JP | 2010-153413 A | 7/2010 |
| JP | WO2009/060744 | 3/2011 |
| JP | WO2012/169090 | 2/2012 |
| JP | 2015-005676 A | 1/2015 |
| JP | 2015-111672 A | 6/2015 |
| JP | 2015-111673 A | 6/2015 |
| WO | WO 2005/026843 A2 | 3/2005 |
| WO | WO 2009/100856 A1 | 8/2009 |
| WO | WO 2010/006687 A1 | 1/2010 |
| WO | WO 2010/044307 A1 | 4/2010 |
| WO | WO 2012/028158 A1 | 3/2012 |
| WO | WO 2012/100791 A1 | 8/2012 |
| WO | WO 2015/074746 A1 | 5/2015 |

OTHER PUBLICATIONS

E. Delano, "First-order Design and the $y$, $\bar{y}$ Diagram", Applied Optics, 1963, vol. 2, No. 12, pp. 1251-1256.

Japanese Office Action, with translation thereof, for corresponding JP Appl No. 2018-515432, dated May 27, 2019.

* cited by examiner

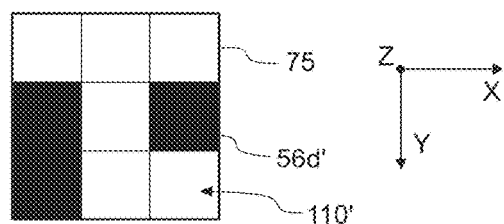
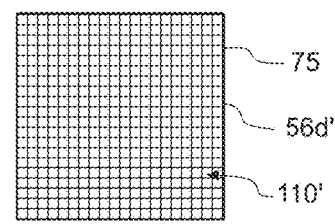
Fig. 12              Fig. 14
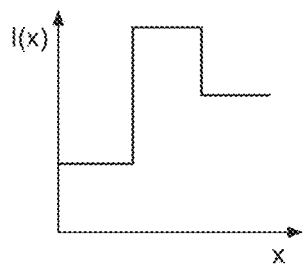
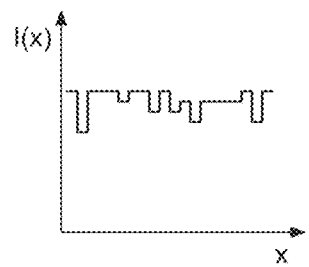
Fig. 13              Fig. 15
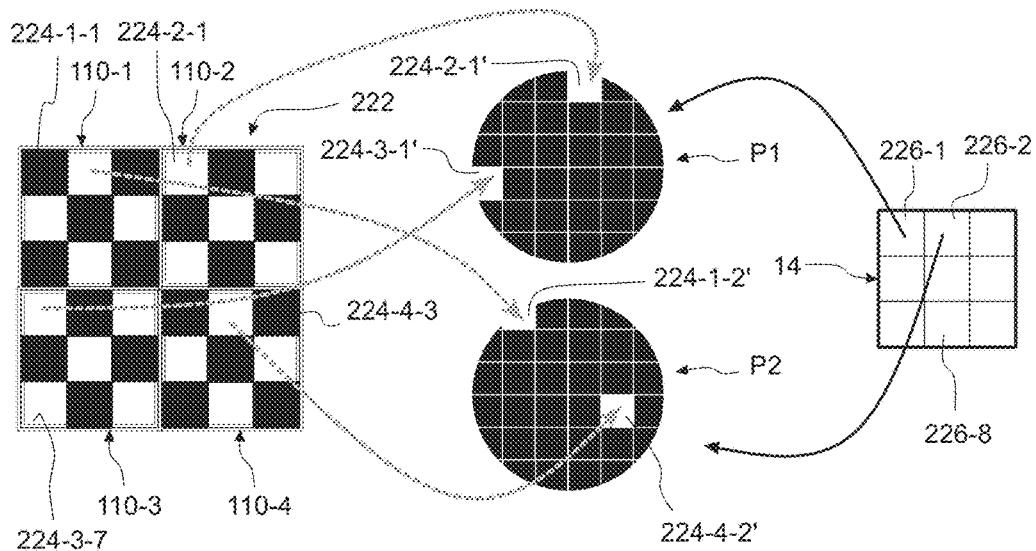
Fig. 17

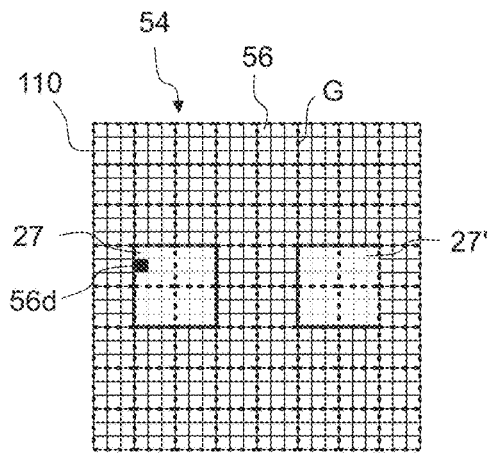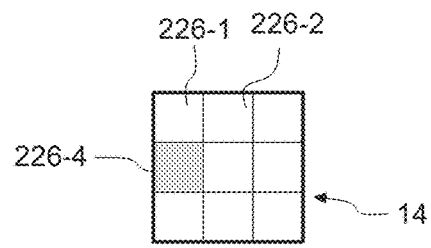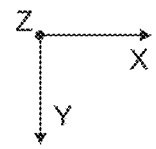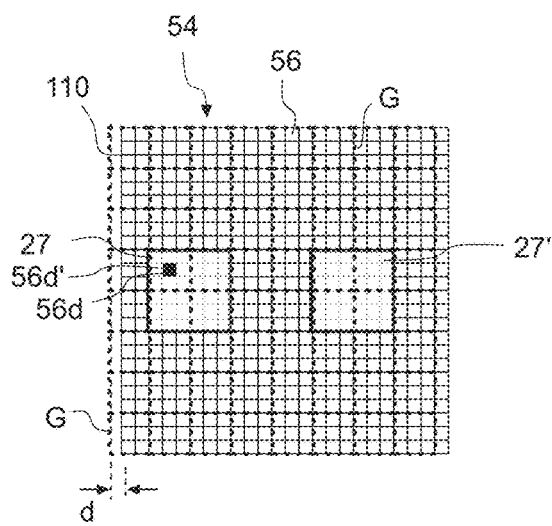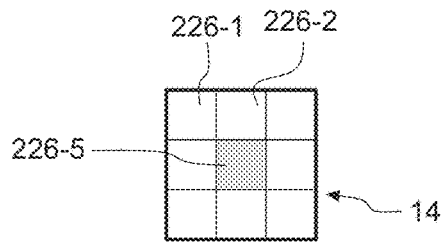
Fig. 25A      Fig. 25B
Fig. 26A      Fig. 26B

METHOD OF OPERATING A MICROLITHOGRAPHIC PROJECTION APPARATUS AND ILLUMINATION SYSTEM OF SUCH AN APPARATUS

CROSS-REFERENCE TO RELATED APPLICATION

The present application is a continuation of, and claims benefit under 35 USC 120 to, international application PCT/EP2015/071826, filed Sep. 23, 2015. The entire disclosure of this application is incorporated by reference herein.

FIELD

The disclosure generally relates to the field of microlithography, and in particular to illumination systems used in projection exposure apparatus or mask inspection apparatus. The disclosure is particularly concerned with the ability of such systems to modify the angular irradiance distribution (illumination setting) in a field dependent manner.

BACKGROUND

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as deep ultraviolet (DUV) or vacuum ultraviolet (VUV) light. Next, the wafer with the photoresist on top is exposed to projection light in a projection exposure apparatus. The apparatus projects a mask containing a pattern onto the photoresist so that the latter is only exposed at certain locations which are determined by the mask pattern. After the exposure the photoresist is developed to produce an image corresponding to the mask pattern. Then an etch process transfers the pattern into the thin film stacks on the wafer. Finally, the photoresist is removed. Repetition of this process with different masks results in a multi-layered microstructured component.

A projection exposure apparatus typically includes a light source, an illumination system that illuminates the mask with projection light produced by the light source, a mask stage for aligning the mask, a projection objective and a wafer alignment stage for aligning the wafer coated with the photoresist. The illumination system illuminates a field on the mask that may have the shape of a rectangular or curved slit, for example.

In current projection exposure apparatus a distinction can be made between two different types of apparatus. In one type each target portion on the wafer is irradiated by exposing the entire mask pattern onto the target portion in one go. Such an apparatus is commonly referred to as a wafer stepper. In the other type of apparatus, which is commonly referred to as a step-and-scan apparatus or scanner, each target portion is irradiated by progressively scanning the mask pattern under the projection beam along a scan direction while synchronously moving the substrate parallel or anti-parallel to this direction. The ratio of the velocity of the wafer and the velocity of the mask is equal to the magnification of the projection objective, which is usually smaller than 1, for example 1:4.

It is to be understood that the term "mask" (or reticle) is to be interpreted broadly as a patterning device. Commonly used masks contain opaque or reflective patterns and may be of the binary, alternating phase-shift, attenuated phase-shift or various hybrid mask type, for example. However, there are also active masks, e.g. masks realized as a programmable mirror or LCD array.

As the technology for manufacturing microstructured devices advances, there are ever increasing demands also on the illumination system. Ideally, the illumination system illuminates each point of the illumination field on the mask with projection light having a well defined irradiance and angular irradiance distribution. The term angular irradiance distribution describes how the total light energy of a light bundle, which converges towards a particular point in the mask plane, is distributed among the various directions of the rays that constitute the light bundle.

The angular irradiance distribution of the projection light impinging on the mask is usually adapted to the kind of pattern to be projected onto the photoresist. Often the optimum angular irradiance distribution depends on the size, orientation and pitch of the features contained in the pattern. The most commonly used angular irradiance distributions of projection light are referred to as conventional, annular, dipole and quadrupole illumination settings. These terms refer to the irradiance distribution in a pupil plane of the illumination system. With an annular illumination setting, for example, only an annular region is illuminated in the pupil plane. Thus there is only a small range of angles present in the angular irradiance distribution of the projection light, and all light rays impinge obliquely with similar angles onto the mask.

Different approaches are known in the art to modify the angular irradiance distribution of the projection light in the mask plane so as to achieve the desired illumination setting. In the simplest case a stop (diaphragm) including one or more apertures is positioned in a pupil plane of the illumination system. Since locations in a pupil plane translate into angles in a Fourier related field plane such as the mask plane, the size, shape and location of the aperture(s) in the pupil plane determines the angular irradiance distributions in the mask plane. However, any change of the illumination setting involves a replacement of the stop. This makes it difficult to finely adjust the illumination setting, because this would involve a very large number of stops that have aperture(s) with slightly different sizes, shapes or locations. Furthermore, the use of stops inevitably results in light losses and thus in a reduced throughput of the apparatus.

Many common illumination systems therefore include adjustable elements that make it possible, at least to a certain extent, to continuously vary the illumination of the pupil plane. Often these systems use an exchangeable diffractive optical element to produce a desired spatial irradiance distribution in the pupil plane. If zoom optics and a pair of axicon elements are provided between the diffractive optical element and the pupil plane, it is possible to adjust this spatial irradiance distribution to some extent.

Recently it has been proposed to use mirror arrays that illuminate the pupil plane. In an illumination system known from EP 1 262 836 A1 the mirror array is realized as a micro-electromechanical system (MEMS) including more than 1000 microscopic mirrors. Each of the mirrors can be tilted in two different planes perpendicular to each other. Thus radiation incident on such a mirror device can be reflected into almost any desired direction of a hemisphere.

Each mirror produces a spot in the pupil plane that is freely movable by tilting the mirror.

Similar illumination systems are known from US 2006/0087634 A1, U.S. Pat. No. 7,061,582 B2, WO 2005/026843 A2 and WO 2010/006687 A1.

As mentioned further above, it is usually desired to illuminate, at least after scan integration, all points on the mask with the same irradiance and angular irradiance distribution. If points on the mask are illuminated with different irradiances, this usually results in undesired variations of the critical dimension (CD) on wafer level. For example, in the presence of irradiance variations the image of a uniform line on the mask on the light sensitive may also have irradiance variations along its length. Because of the fixed exposure threshold of the resist, such irradiance variations directly translate into widths variations of a structure that shall be defined by the image of the line.

If the angular irradiance distribution unintentionally varies over the illumination field on the mask, this also has a negative impact on the quality of the image that is produced on the light sensitive surface. For example, if the angular irradiance distribution is not perfectly balanced, i.e more light impinges from one side on a mask point than from the opposite side, the conjugate image point on the light sensitive surface will be laterally shifted if the light sensitive surface is not perfectly arranged in the focal plane of the projection objective.

In the following some approaches are described how the angular irradiance distribution can be modified in a field dependent manner.

WO 2012/100791 A1 discloses an illumination system in which a mirror array is used to produce a desired irradiance distribution in the pupil plane of the illumination system. In close proximity to the pupil plane a fly's eye optical integrator is arranged that has a plurality of light entrance facets. Images of the light entrance facets are superimposed on the mask. The light spots produced by the mirror array have an area that is at least five times smaller than the total area of the light entrance facets. This makes it possible to produce variable light patterns on the light entrance facets, and thus different angular irradiance distributions at different portions of the illumination field. For example, at one portion of the illumination field an X dipole and at another portion of the illumination field a Y dipole illumination setting may be produced.

WO 2012/028158 A1 discloses an illumination system in which the irradiance distribution on the light entrance facets of the fly's eye optical integrator is modified with the help of a plurality of modulator units that are arranged in front of the optical integrator. Each modulator unit is associated with one of the light entrance facets and variably redistributes, without blocking any light, the spatial and/or angular irradiance distributions on the associated light entrance facet. In this manner it is possible, for example, to illuminate, with different illumination settings, two or more different portions on a single die that are associated with different semiconductor devices.

WO 2015/074746 A1 discloses an approach in which the irradiance distribution on the light entrance facets of a fly's eye optical integrator is modified by imaging a digital mirror device (DMD) on the light entrance facets. This approach is advantageous because it is not necessary to produce very small light spots with an analog micromirror array, as this is the case in the illumination system known from WO 2012/100791 A1 mentioned above. The field dependency of the angular irradiance distribution is adjusted so that the angular irradiance distribution over the illumination field becomes perfectly uniform (i.e. field independent). It is also mentioned that it may sometimes be desirable to deliberately introduce a field dependency of the angular irradiance distribution. This may be expedient, for example, if the projection objective or the mask has field depending properties. As far as the mask is concerned, such field depending properties are usually a result of features that have different orientations or dimensions. Adverse effects resulting from such field dependencies can be successfully reduced by selectively introducing a field dependency of the angular irradiance distribution.

However, it turned out that occasionally the angular irradiance distribution produced with the illumination system known from the aforementioned WO 2015/074746 A1 slightly deviates from the expected target distribution although the digital mirror device has been correctly controlled.

SUMMARY

The disclosure seeks to provide a method of operating a microlithographic projection apparatus which makes it possible to reliably and predictably modify the angular irradiance distribution at mask level with the help of a digital mirror device or another spatial light modulator.

In one aspect, the disclosure provides a method that includes a step a) in which a spatial light modulator such as a digital mirror device (DMD) is provided. The spatial light modulator has a modulation surface which is formed by a plurality of micromirrors. Each micromirror includes a mirror surface having an orientation that can be changed individually for each micromirror. In a step b) at least one parameter that is related to the mirror surface is measured for at least one of the micromirrors. In a step c) the orientation of the mirror surfaces is controlled depending on the at least one parameter that has been measured in step b). Then a light pattern is produced on the modulation surface in a step d), and in step e) an image of the light pattern is formed on an optical integrator that has a plurality of light entrance facets, Images of the light entrance facets are superimposed on the mask in a last step f).

The disclosure is based on the conception that small deviations that are sometimes observed between the real angular irradiance distributions on the one hand and the desired target angular irradiance distribution are mainly due to the fact that certain parameters related to the mirror surface of the micromirrors are not within the specified values anymore. The most important parameters in this context are the position and the orientation of the mirror surface. The term "position" shall denote in this context the Cartesian coordinates of an element such as the tilt axis that does not move when the mirror surface is tilted. The orientation of the mirror surface denotes the tilting angle of the mirror surface with respect to the tilt axis. If the micromirror has two tilt axes, the orientation is defined by two tilting angles, correspondingly.

It is evident that the angular irradiance distribution is affected if the mirror surface is not at the specified position or not in the specified orientation. However, since the spatial light modulator is usually fixedly arranged in a housing of the illumination system, and the same also applies for the optical integrator on which an image of the modulation surface is formed, the relative position between the mirror surfaces and the optical integrator should be fixed. However, it turned out that as a result of the minute dimensions of the light entrance facets and the mirror surfaces, even extremely small drift movements of the spatial light modulator and/or the optical integrator suffice to compromise the angular irradiance distribution at mask level. Such drift movements may be caused by thermal effects, for example, because both the spatial light modulator and the optical integrator absorb an—albeit small—fraction of the impinging projection light. Therefore these components heat up if the illumination system is operated for a prolonged period.

Similar considerations also apply to the orientation of the mirror surfaces. Although the total number of mirror surfaces may be in a range between $10^6$ and $10^8$, it turned out that even a failure of a single mirror surface may have a noticeable effect on the angular irradiance distribution at mask level.

Another parameter that is related to the mirror surface and which might be measured in step b) is the reflectivity of the mirror surface. The reflectivity may decrease during the operation of the illumination system as a result of a material degradation of the reflective coating caused by the high energy projection light.

In accordance with the disclosure, the position, orientation or another parameter that is related to the mirror surface and measured in step b), is taken into account when the orientation of the micromirrors is controlled during the regular operation of the illumination system. For example, if it has been measured in step b) that the mirror surface is laterally displaced, step c) may include the step of laterally shifting a control pattern. This may involve, for example, that a certain three-dimensional pattern of "on" and "off" states is simply shifted by one (or even more than one) micromirrors along one or two directions.

Then the change of the relative position between the spatial light modulator on the one hand and the optical integrator on the other hand can be compensated for by a modified control of the micromirrors.

If a certain micromirror has failed so that it cannot change its orientation any more, or if the reflective mirror surface has degraded so that it reflects less projection light than expected, this may be partially compensated for by suitably changing the control of other micromirrors that illuminate the same field point.

In the following different approaches are described how the at least one parameter that is related to the mirror surface can be efficiently measured.

Since the available space in the illumination system is often restricted, one approach is to measure the at least one parameter not directly on the mirror surface, but only the effect that is produced by the mirror surface at mask level. Then the measuring devices can be arranged remotely from the mirror surface at positions such as the mask or the wafer plane that are easily accessible from the outside of the illumination system.

According to one specific embodiment of this "remote" approach, step b) includes the step of measuring an angular irradiance distribution at least at one field point in the mask plane or a plane that is optically conjugate to the mask plane. Usually a large number of micromirrors contribute to the illumination of a specific field point in the mask plane or another field plane. Based on measurements of the directions from which light impinges on the at least one field point, one may then calculate the positions and orientations of these micromirrors. In this manner it is possible, for example, to obtain position information relating to the spatial light modulator with a single measurement at one field point.

If the orientation of all mirror surfaces shall be determined, the angular irradiance distribution has to be measured at a plurality of field points in the mask plane or the plane that is optically conjugate to the mask plane. This is because only a fraction of the micromirrors contribute to the illumination of a single field point, and if orientations shall be determined for all micromirrors, a correspondingly large number of measurements have to be performed at mask level. Since this is a time consuming process, the angular irradiance distribution is preferably measured simultaneously at a plurality of field points.

To this end a plurality of position resolving light sensors may be arranged at positions that are associated with the plurality of field points. Each light sensor measures the angular irradiance distribution for the associated field point.

A similar "remote" approach to measure the at least one parameter related to the mirror surface is to measure an irradiance at least at one field point in the mask plane or a plane that is optically conjugate to the mask plane. This approach exploits the fact that each field point in the mask plane can be illuminated from a large plurality of different micromirrors. Since the micromirrors can be controlled individually, it is possible to control the micromirrors so that, at a given time, only one micromirror illuminates a specific field point. In this manner information regarding the orientation of the micromirror can be easily obtained.

The position of the mirror surfaces can also be calculated from the position of the illuminated field point. If the mirror surface is laterally displaced, also its image in the mask plane will be laterally displaced.

At least for the measuring of the orientation of the mirror surfaces a large number of measurements have to be performed. Therefore it is preferred to measure the irradiance simultaneously at the plurality of field points. To this end a plurality of light sensors may be arranged at the plurality of field points. Each light sensor measures the irradiance at the associated field point.

The remote measurement of the at least one parameter by measuring the irradiance or the angular irradiance distribution at a field plane usually involves the step of computing the at least one parameter based on the shape of the mirror surface, the spatial arrangement of the modulation surface relative to the light entrance facets, and the shape of the light entrance facets. Also other quantities may have to be taken into account, for example the optical effects produced by all optical elements in the light path between the spatial light modulator and the field plane where the measurement is performed.

Mainly as a result of diffraction and aberrations, the images of adjacent micromirrors on the mask plane (or another field plane) may overlap to some extent. Such an overlap may compromise the measurements of the irradiance or the angular irradiance distribution at one or more field points.

In order to reduce such adverse effects, the mirror surfaces may be controlled such that adjacent mirror surfaces do not superimpose light on the mask. For example, in the light patterns, which are produced in the modulation surface during the measurement, a micromirror being in an "on" state may be completely surrounded by micromirrors being in an "off" state. Also a chessboard-like light pattern significantly reduces any adverse effects associated with overlapping images of adjacent mirror surfaces in the field plane.

Another approach for measuring the at least one parameter involves the detection of a position of a marker point that is fixedly arranged with respect to the spatial light modulator. This approach is based on the perception that the position of the optical integrator can usually be kept very stable during the operation of the illumination system, while the spatial light modulator is more likely to drift.

Preferably the marker point is arranged directly on the spatial light modulator and as close as possible to the micromirrors. In principle, however, it is also possible to arrange the marker point further away from the spatial light modulator on a support structure that is rigidly connected to the spatial light modulator so that any drift movements of the latter are precisely transferred to the marker point.

The marker point may be formed by any element or structure whose position can be detected well with the help of conventional position detectors. For example, the marker point may be realized by a small reflective surface area on which a measuring light beam of an interferometric measurement system can be directed. The marker point may be also formed by a laser diode or another light emitting element that emits a measuring light beam.

Since it is difficult to produce a spatial light modulator that includes a number of micromirrors that is sufficiently large for this purpose, it may be envisaged to split up the spatial light modulator into two or more modulator units that can be manufactured more easily. In that case the modulator units are separated by a gap that is larger than the distance between adjacent micromirrors of one of the modulator units. A stitching optics may be provided that stitches together the images of the active areas of each modulator units on the optical integrator. More details with regard to the stitching optics can be found in US 2015/0146183 A1.

If the modulator units are separated from each other, the modulator units may perform different relative movements so that the relative arrangement of the modulator unit changes during operation of the illumination system. Even if the modulator units are attached to a common rigid support structure, the thermal expansion of the support structure may result in a change of the relative arrangement of the modulator units. In these cases it may be advantageous to provide each modulator unit with at least one marker point. Then the position of each modulator unit can be detected individually so that relative drift movements between the modulator units can be detected and taken into account during the control of the micromirrors.

Preferably the marker point is arranged on the rear side of the modulator units on which no projection light impinges. Then there is no risk that the detection of the marker point interferes with the modulation of the projection light.

A particular approach to detect the position of the marker point is to image the marker point on a position resolving light detector that is fixedly arranged with respect to the optical integrator. Preferably this image is produced by an imaging optical system that also forms the image of the light pattern on the optical integrator. Since the marker point is outside the micromirrors, the image of the light pattern and the image of the marker point do not overlap, and thus the measurement of the position of the marker point cannot interfere with the modulation of the projection light. Also in this configuration the marker point may be formed by a reflective surface area or a light source that emits a measuring light beam, for example.

If the marker point is not arranged directly on the spatial light modulator, it may be fixed on a support structure of the spatial light modulator. Similarly, if the position resolving light detector is not arranged directly on the optical integrator, it may be fixed on a support structure of the optical integrator. The support structure should be as rigid as possible so that any drift movement of the optical integrator, and in particular of the spatial light modulator, is completely transferred to the position resolving light detector or the marker point, respectively.

Another approach to measure the at least one parameter is to observe the modulation surface by a camera which detects light that has been reflected or scattered by the micromirrors or by structures between the micromirrors. In principle it is possible to use the projection light and at least a part of the imaging optical system, which forms the image of the light pattern on the optical integrator, also for such a measurement.

Preferably, however, the modulation surface is illuminated by measuring light and by projection light which is used to image a mask on a light sensitive surface. The wavelengths of the measuring light and of the projection light do not overlap. The camera is arranged in an optical path of the measuring light, but outside an optical path of the projection light. This ensures that the measurement of the at least one parameter in step b) does not interfere with modulation of the projection light. The measuring light has to be directed towards the modulation surface such that in at least one of the possible orientations of the mirror surfaces the measuring light is directed towards the camera.

Also scattered measuring light may be used to detect the orientation and also the position of the mirror surfaces. In that case it is desirable for the angular irradiance distribution of the scattered light to be anisotropic so that a change of the position or the orientation of the mirror surface results in a change of the irradiance in the image plane of the camera. It is even possible to use light, which has been reflected from the gaps between adjacent mirror surfaces, for measuring the position and/or orientation of the mirror surfaces. This is due to the fact that the orientation and position of the mirror surfaces also modify the light that has been reflected or scattered by the structures between the micromirrors.

For such measurements it may be advantageous to direct the measuring light from different directions on the modulator surface of the spatial light modulator.

The position of the spatial light modulator can even be detected with the help of the camera if the images of the individual micromirrors cannot be resolved by the camera. In that case measuring light that emerged from a group of micromirrors may be sufficient.

The simplest approach to measure the orientation of the micromirrors is to relay on on-board electronic sensors that are arranged underneath or between the micromirrors on a common support. However, with such sensors only the orientation of the mirror surfaces can be detected.

Subject of the disclosure is also an illumination system of a microlithographic projection apparatus including a spatial light modulator having a modulation surface which is formed by a plurality of micromirrors. Each micromirror includes a mirror surface having an orientation that can be changed individually for each micromirror. A measuring device is configured to measure, for at least one of the micromirrors, at least one parameter that is related to the mirror surface. A control unit is configured to control the orientation of the micromirrors depending on the at least one parameter that has been measured by the measuring device. An imaging optical system is configured to form an image of the modulation surface on any arbitrary field plane, for example on a raster field plane of an optical integrator that has a plurality of light entrance facets.

The at least one parameter may be selected from the group consisting of: position of the mirror surface and orientation of the mirror surface.

The measuring device may include a pupil measuring unit that is configured to measure an angular irradiance distribution at least at one field point in the mask plane or a plane that is optically conjugate to the mask plane. The pupil measuring unit may be configured to measure the angular irradiance distribution simultaneously at a plurality of field points in the mask plane or a plane that is optically conjugate to the mask plane.

In that case the pupil measuring unit may include a plurality of position resolving light sensors that are arranged at positions that are associated with the plurality of field points. Each light sensor measures the angular irradiance distribution for the associated field point.

The measuring device may alternatively may include an irradiance measuring unit that is configured to measure the irradiance at least at one field point in the mask plane or a plane that is optically conjugate to the mask plane.

If the at least one parameter is the orientation of the mirror surface, the irradiance measuring unit may be configured to measure the irradiance simultaneously at a plurality of field points in the mask plane or a plane that is optically conjugate to the mask plane.

The irradiance measuring unit may include a plurality of light sensors that are arranged at the plurality of field points. Each light sensor may be configured to measure the irradiance at the associated field point.

The control unit may be configured to compute the at least one parameter based on the shape of the mirror surfaces, the spatial arrangement of the modulation surface relative to the light entrance facets, and the shape of a light entrance facets.

The control unit may be configured to control the orientations of the micromirrors such that adjacent micromirrors do not superimpose light on the mask.

The measuring device may include a maker point that is fixedly arranged with respect to the spatial light modulator, and a detector that is configured to detect the position of the marker point.

The spatial light modulator may include at least two modulator units that are separated from each other. Each modulator unit may include a plurality of micromirrors and support at least one marker point.

The marker point may be arranged on a rear side of the modulator units on which no projection light impinges.

The modulator units may be separated by a gap that is larger than a distance between adjacent micromirrors of one of the modulator units.

The detector may be a position resolving light detector that is fixedly arranged with respect to the optical integrator such that the imaging optical system forms an image of the marker on the position resolving light detector.

The marker point may be configured to emit a measuring light beam.

The marker point may be fixed on a support structure of the spatial light modulator. The position resolving light detector may be fixed on a support structure of the optical integrator.

The measuring device may include a camera that is configured to observe the modulation surface and to detect light that has been reflected or scattered by the micromirrors or by structures between the micromirrors.

The measuring device may include a measuring light source that is configured to illuminate the modulation surface. The wavelengths of the measuring light and of the projection light, which is used to image a mask in a light sensitive surface, do not overlap. A camera may be arranged in an optical path of the measuring light, but outside an optical path of the projection light.

The spatial light modulator may be illuminated by a pupil forming unit that includes a first beam deflection area of first reflective or transparent beam deflection elements. Each beam deflection element illuminates a spot on the spatial light modulator at a position that is variable by changing a deflection angle produced by the beam deflection element.

Subject of the disclosure is also a method of operating an illumination system of a microlithographic projection apparatus, including a step a) in which a spatial light modulator is provided. The spatial light modulator has a modulation surface which is formed by a plurality of micromirrors. Each micromirror includes a mirror surface having an orientation that can be changed individually for each micromirror. In a step b) at least one parameter that is related to the mirror surface is measured for at least one of the micromirrors. In a step c) the orientation of the mirror surfaces is controlled depending on the at least one parameter that has been measured in step b). Then a light pattern is produced on the modulation surface in a step d), and in step e) an image of the light pattern is formed on a field plane.

Definitions

The term "light" is used herein to denote any electromagnetic radiation, in particular visible light, UV, DUV, VUV and EUV light and X-rays.

The term "light ray" is used herein to denote light whose path of propagation can be described by a line.

The term "light bundle" is used herein to denote a plurality of light rays that have a common origin in a field plane.

The term "light beam" is used herein to denote all light that passes through a particular lens or another optical element.

The term "position" is used herein to denote the location of a reference point of a body in the three-dimensional space. The position is usually indicated by a set of three Cartesian or polar coordinates. The orientation and the position therefore fully describe the placement of a body in the three-dimensional space.

The term "surface" is used herein to denote any plane or curved surface in the three-dimensional space. The surface may be part of a body or may be completely separated therefrom, as it is usually the case with a field or a pupil plane.

The term "field plane" is used herein to denote the mask plane or any other plane that is optically conjugate to the mask plane.

The term "pupil plane" is a plane in which (at least approximately) a Fourier relationship is established to a field plane. Generally marginal rays passing through different points in the mask plane intersect in a pupil plane, and chief rays intersect the optical axis. As usual in the art, the term "pupil plane" is also used if it is in fact not a plane in the mathematical sense, but is slightly curved so that, in the strict sense, it should be referred to as pupil surface.

The term "uniform" is used herein to denote a property that does not depend on the position.

The term "optical raster element" is used herein to denote any optical element, for example a lens, a prism or a diffractive optical element, which is arranged, together with other identical or similar optical raster elements so that each optical raster element is associated with one of a plurality of adjacent optical channels.

The term "optical integrator" is used herein to denote an optical system that increases the product NA·α, wherein NA is the numerical aperture and α is the illumination field area.

The term "condenser" is used herein to denote an optical element or an optical system that establishes (at least approximately) a Fourier relationship between two planes, for example a field plane and a pupil plane.

The term "conjugated plane" is used herein to denote planes between which an imaging relationship is established. More information relating to the concept of conjugate planes are described in an essay E. Delano entitled: "First-order Design and the y, ȳ Diagram", Applied Optics, 1963, vol. 2, no. 12, pages 1251-1256.

The term "field dependency" is used herein to denote any functional dependency of a physical quantity from the position in a field plane.

The term "angular irradiance distribution" is used herein to denote how the irradiance of a light bundle varies depending on the angles of the light rays that constitute the light bundle. Usually the angular irradiance distribution can be described by a function $I_\alpha(\alpha, \beta)$, with $\alpha, \beta$ being angular coordinates describing the directions of the light rays. If the angular irradiance distribution has a field dependency so that it varies at different field points, $I_\alpha$ will be also a function of field coordinates, i.e. $I_\alpha=I_\alpha(\alpha, \beta, x, y)$. The field dependency of the angular irradiance distribution may be described by a set of expansion coefficients $\alpha_{ij}$ of a Taylor (or another suitable) expansion of $I_\alpha(\alpha, \beta, x, y)$ in x, y.

The term "irradiance" is used herein to denote the total irradiance that can be measured at a particular field point. The irradiance can be deduced from the angular irradiance distribution by integrating over all angles $\alpha, \beta$. The irradiance has usually also a field dependency so that $I_s=I_s(x,y)$ with x, y being spatial coordinates of the field point. The field dependency of the irradiance is also referred to as spatial irradiance distribution. In a projection apparatus of the scanner type, the light dose at a field point is obtained by integrating the irradiance over the time.

BRIEF DESCRIPTION OF THE DRAWINGS

Various features and advantages of the present disclosure may be more readily understood with reference to the following detailed description taken in conjunction with the accompanying drawings in which:

FIG. 12 illustrates an irradiance distribution on a light entrance facet of the optical integrator;

FIG. 13 is a graph showing the scan integrated irradiance distribution along the X direction produced by the light entrance facet shown in FIG. 12;

FIG. 14 illustrates another irradiance distribution on a light entrance facet of the optical integrator;

FIG. 15 is a graph showing the scan integrated irradiance distribution along the X direction produced by the light entrance facet shown in FIG. 14;

FIG. 17 illustrates how a pupil measurement at different field positions provides information with regard to the position and the orientation of mirror surfaces;

FIG. 25A is a top view similar to FIG. 11A on the micromirror array of the spatial light modulator;

FIG. 25B illustrates the irradiance distribution in the illumination field 14;

FIG. 26A is a top view similar to FIG. 25A after a drift movement of the spatial light modulator;

FIG. 26B illustrates the effect of the drift movement on the illumination field 14;

DESCRIPTION OF PREFERRED EMBODIMENTS

I. General Construction of Projection Exposure Apparatus

Figure 1:
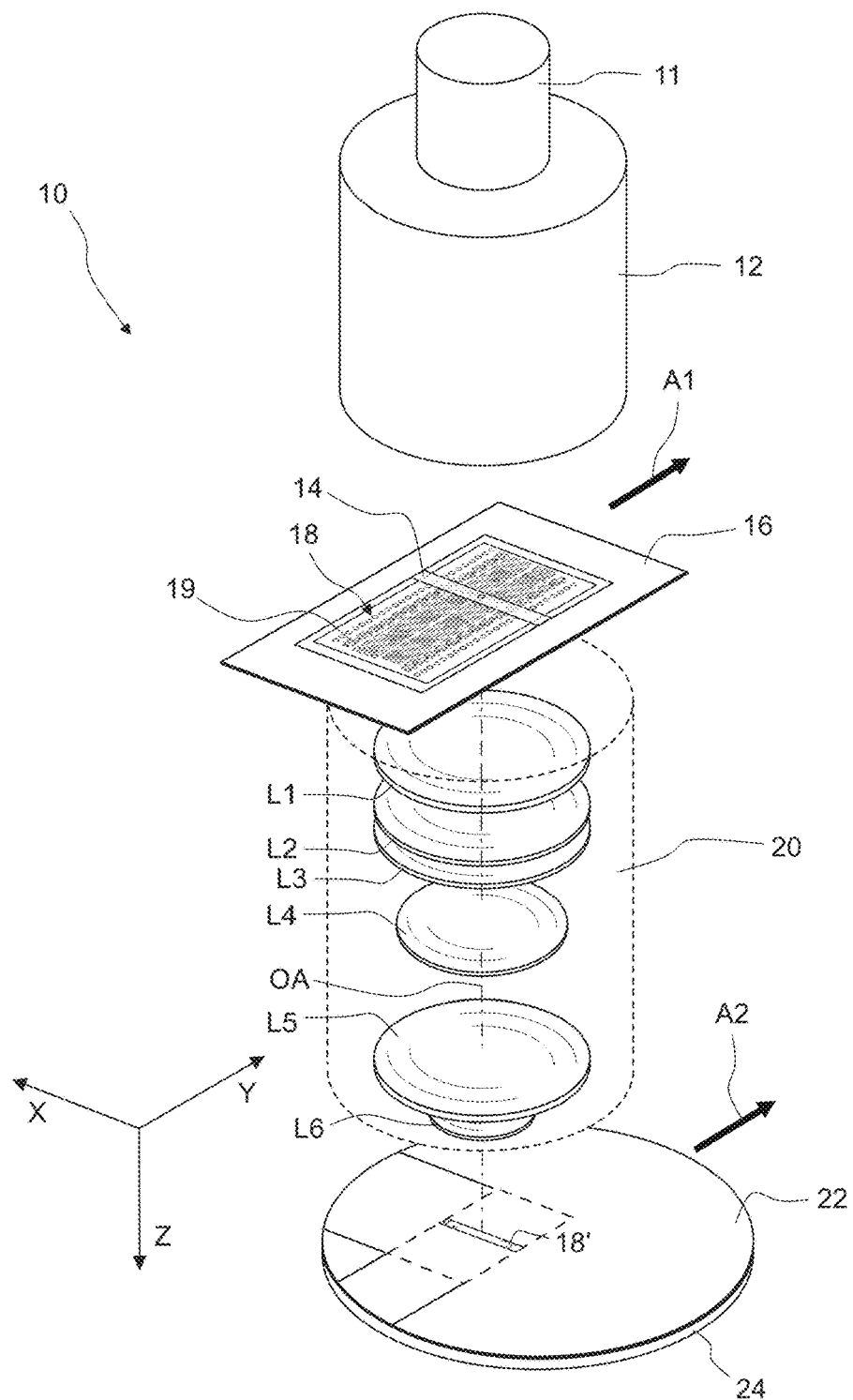
FIG. 1 is a schematic perspective view of a projection exposure apparatus in accordance with one embodiment of the present disclosure.

FIG. 1 is a perspective and highly simplified view of a projection exposure apparatus 10 in accordance with the present disclosure. The apparatus 10 includes a light source 11 that may be realized as an excimer laser, for example. The light source 11 in this embodiment produces projection light having a center wavelength of 193 nm. Other wavelengths, for example 157 nm or 248 nm, are envisaged as well.

The apparatus 10 further includes an illumination system 12 which conditions the projection light provided by the light source 11 in a manner that will be explained below in further detail. The projection light emerging from the illumination system 12 illuminates an illumination field 14 on a mask 16. The mask 16 contains a pattern 18 formed by a plurality of small features 19 that are schematically indicated in FIG. 1 as thin lines. In this embodiment the illumination field 14 has the shape of a rectangle. However, other shapes of the illumination field 14, for example a ring segment, are also contemplated.

A projection objective 20 including lenses L1 to L6 images the pattern 18 within the illumination field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification β with |β|<1, a minified image 18' of the pattern 18 within the illumination field 14 is projected onto the light sensitive layer 22.

During the projection the mask 16 and the substrate 24 move along a scan direction which corresponds to the Y direction indicated in FIG. 1. The illumination field 14 then scans over the mask 16 so that patterned areas larger than the illumination field 14 can be continuously imaged. The ratio between the velocities of the substrate 24 and the mask 16 is equal to the magnification β of the projection objective 20. If the projection objective 20 does not invert the image (β>0), the mask 16 and the substrate 24 move along the same direction, as this is indicated in FIG. 1 by arrows A1 and A2. However, the present disclosure may also be used in stepper tools in which the mask 16 and the substrate 24 do not move during projection of the mask.

II. Field Dependent Angular Irradiance Distribution

Figure 2A:
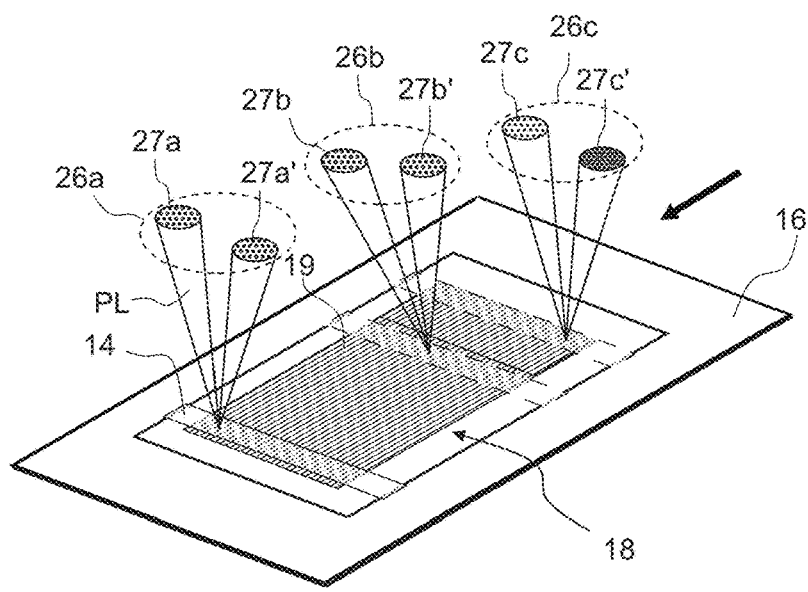
FIG. 2A is an enlarged perspective view of the mask to be projected by the projection exposure apparatus shown in FIG. 1, illustrating local variations of the angular irradiance distribution on the mask.

FIG. 2A is an enlarged perspective view of the mask 16 containing another exemplary pattern 18. For the sake of simplicity it is assumed that the pattern 18 is uniform, i.e. it includes only identical features 19 that extend along the Y direction and are spaced apart by the same distance. It is further assumed that these features 19 are best imaged on the light sensitive layer 22 with an X dipole illumination setting.

An exit pupil 26a associated with one of three exemplary light bundles is represented by a circle. The light bundle converges towards a field point that is located at a certain X position of the illumination field 14 at a first time during a scan cycle. In the exit pupil 26a two poles 27a and 27a', which are spaced apart along the X direction, represent directions from which projection light PL propagates towards this field point. The light energies concentrated in each pole 27a, 27a' are assumed to be equal. Thus the projection light impinging from the +X direction has the same energy as the projection light PL impinging from the −X direction. Since the features 19 are assumed to be uniformly distributed over the pattern 18, this X dipole illumination setting should be produced at each field point on the mask 16.

Another exit pupil denoted by 26b is associated with a light bundle that converges towards a field point being located at another X position of the illumination field 14 at a later time of the scan cycle. The light energies concentrated in each pole 27b, 27' are again equal. However, as it becomes clear by a comparison with the ideal pole 27a, the pole 27b is slightly displaced. This means that the field point receives the same amount of projection light PL, but the directions from which the projection light PL impinges on the field point are not ideal for imaging the features 19 on the light sensitive layer 22.

A further exit pupil denoted by 26c is associated with a point in the illumination field 14 that is located at still another X position at a still later time of the scan cycle. Here it is assumed that the directions from which the projection light PL impinges on the field point are again ideal for imaging the features 19. Therefore the poles 27c, 27c' have the ideal position, and consequently also the light cones associated with these poles 27c, 27c' have the same cone angle and orientation as the cones associated with the ideal exit pupil 26a. However, the poles 27c, 27c' are not balanced, i.e. the light energies concentrated in the poles 27c, 27c' differ from one another, as this is represented in FIG. 2A by different grey shadings. Thus the projection light PL impinging from the +X direction has less to energy than the projection light PL impinging from the −X direction.

From the foregoing it becomes clear that the ideal angular irradiance distribution represented by the exit pupil 26a is not obtained at each X position in the illumination field 14. The angular irradiance distribution is therefore field-dependent, i.e. at different field points the angular irradiance distribution is different.

A field dependence may not only occur along the X direction, but also along the Y direction within the illumination field 14. Then one point on the mask 16 experiences different angular irradiance distributions while it passes through the illumination field 14 during a scan cycle. If a field dependence along the Y direction (i.e. the scan direction) occurs, it has to be taken into account that the total effect for a particular field point is obtained by integrating the different angular irradiance distributions.

There is a wide variety of further field-dependent deviations of a real angular irradiance distribution from the ideal one. For example, the poles in the exit pupil associated with some field points may be deformed, blurred or may not have a desired non-uniform irradiance distribution.

If field dependent deviations from the ideal angular irradiance distribution occur, this generally has a negative impact on the quality of the pattern image that is formed on the light sensitive layer 22. In particular, the dimensions of the structures that are produced with the help of the apparatus 10 may vary inadvertently, and this may compromise the function of the devices containing these structures. Therefore it is generally desired to eliminate any field dependence of the illumination setting in the illumination field 14. To this end the illumination system 12 has to be capable to influence the angular irradiance distribution in a field dependent manner. Since some of the causes for undesired field dependences of the angular irradiance distribution may change very rapidly, it is usually desirable to change the field dependence very rapidly, too—sometimes even within a single scan cycle.

Occasionally, however, it is desirable to deliberately introduce a field dependence of the angular irradiance distribution. This may be expedient, for example, if the projection objective 20 or the mask 16 have field depending properties that affect the image of the pattern 18 on the light sensitive layer 22. Variations of the imaging properties of the projection objective 20 may occur as a result of manufacturing tolerances, aging phenomena or non-uniform temperature distributions, for example. A field dependence of the mask 16 often occurs as a result of features that have different orientations or dimensions, for example.

Figure 2B:
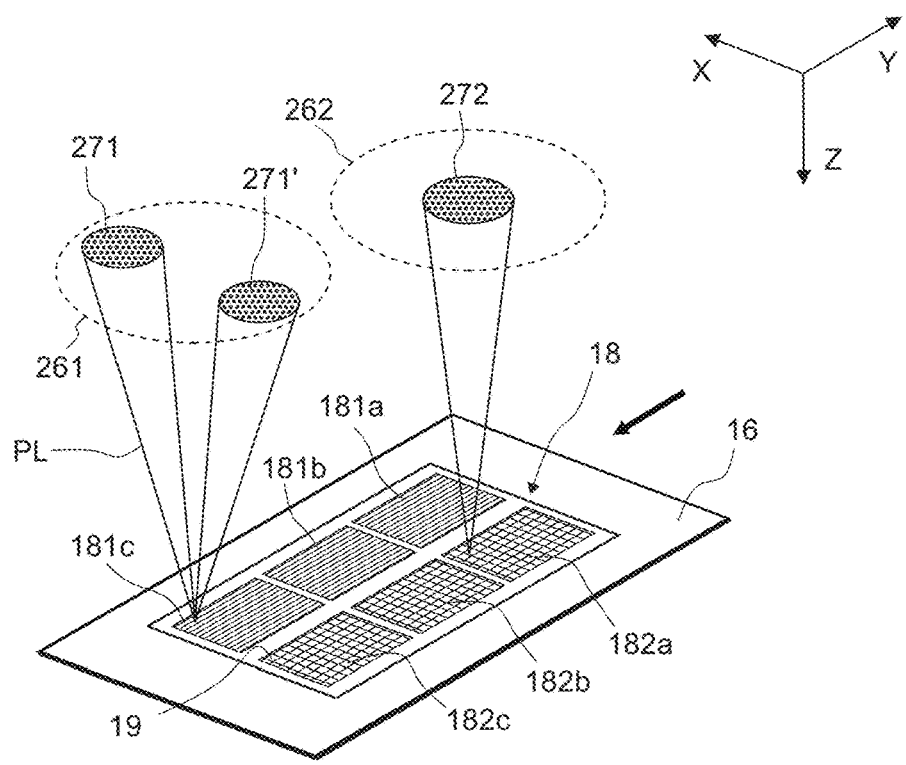
FIG. 2B is an enlarged perspective view similar to FIG. 2A illustrating different angular irradiance distributions that are adapted to different mask patterns.

This is illustrated in FIG. 2B which is an enlarged perspective view of the mask 16 similar to FIG. 2A. For the sake of simplicity, it is assumed that the pattern 18 on the mask 16 includes three first identical pattern areas 181a, 181b, 181c which are arranged one behind the other along the scan direction Y. It is further assumed that the features 19 of the first pattern areas 181a, 181b, 181c are straight lines extending along the scan direction Y.

The pattern 18 further includes three identical second pattern areas 182a, 182b, 182c which are also arranged one behind the other along the scan direction Y, but laterally displaced from the first pattern areas 181a, 181b, 181c so that the first pattern areas 181a, 181b, 181c and the second pattern areas 182a, 182b, 182c have no common X coordinate. It is assumed that the second pattern areas 182a, 182b, 182c contain features 19 extending along the X direction and features 19 extending along the Y direction.

The mask 16 is assumed to be used in a manufacturing step in which two different dies are exposed simultaneously and will be subjected to the same subsequent manufacturing steps such as etching. The dies are small enough so that they can be positioned next to each other within the image field of the projection objective 20. Within one complete scanning cycle three dies of a first type associated with the first pattern areas 181a, 181b, 181c, and three dies of a second type associated with the second pattern areas 182a, 182b, 182c can be exposed. Then the scanning direction is either reversed, or the mask 16 is returned to its original position without any illumination, and a further scanning cycle is performed. In this way two rows of different dies can be exposed simultaneously on the substrate 24.

Generally different patterns involve different angular irradiance distributions at mask level if an optimum image quality is desired. In this embodiment it is assumed that the features 19 extending along the Y direction are best imaged on the light sensitive layer 22 with an X dipole illumination setting. In FIG. 2B the pupil 26₁ associated with a light bundle that converges towards a field point located in one of the first pattern areas is indicated by a broken circle. In the pupil 26₁ two poles 27₁, 27₁', which are spaced apart along the X direction, represent directions from which light propagates towards the field point. Since the patterns are assumed to be uniform over the first pattern areas 181a, 181b, 181c, it is thus desirable for this X dipole illumination setting to be produced at each field point in the first pattern areas 181a, 181b, 181c.

For the features 19 in the second pattern areas 182a, 182b, 182c it is assumed that a conventional illumination setting results in the best image quality. FIG. 2B indicates a central pole 27₂ which is illuminated in the pupil 26₂ associated with a light bundle that converges towards a field point in one of the second pattern areas 182a, 182b, 182c. Again, this conventional illumination setting shall be produced at each field point in the second pattern areas 182a, 182b, 182c.

This implies that the illumination system 12 is desirably capable of producing two different illumination settings simultaneously and side by side within the illumination field 14.

In the following a design of the illumination system 12 which is capable of produce angular irradiance distributions with almost any arbitrary field dependency will be described in more detail with reference to FIGS. 3 to 15.

III. General Construction of Illumination System

Figure 3:
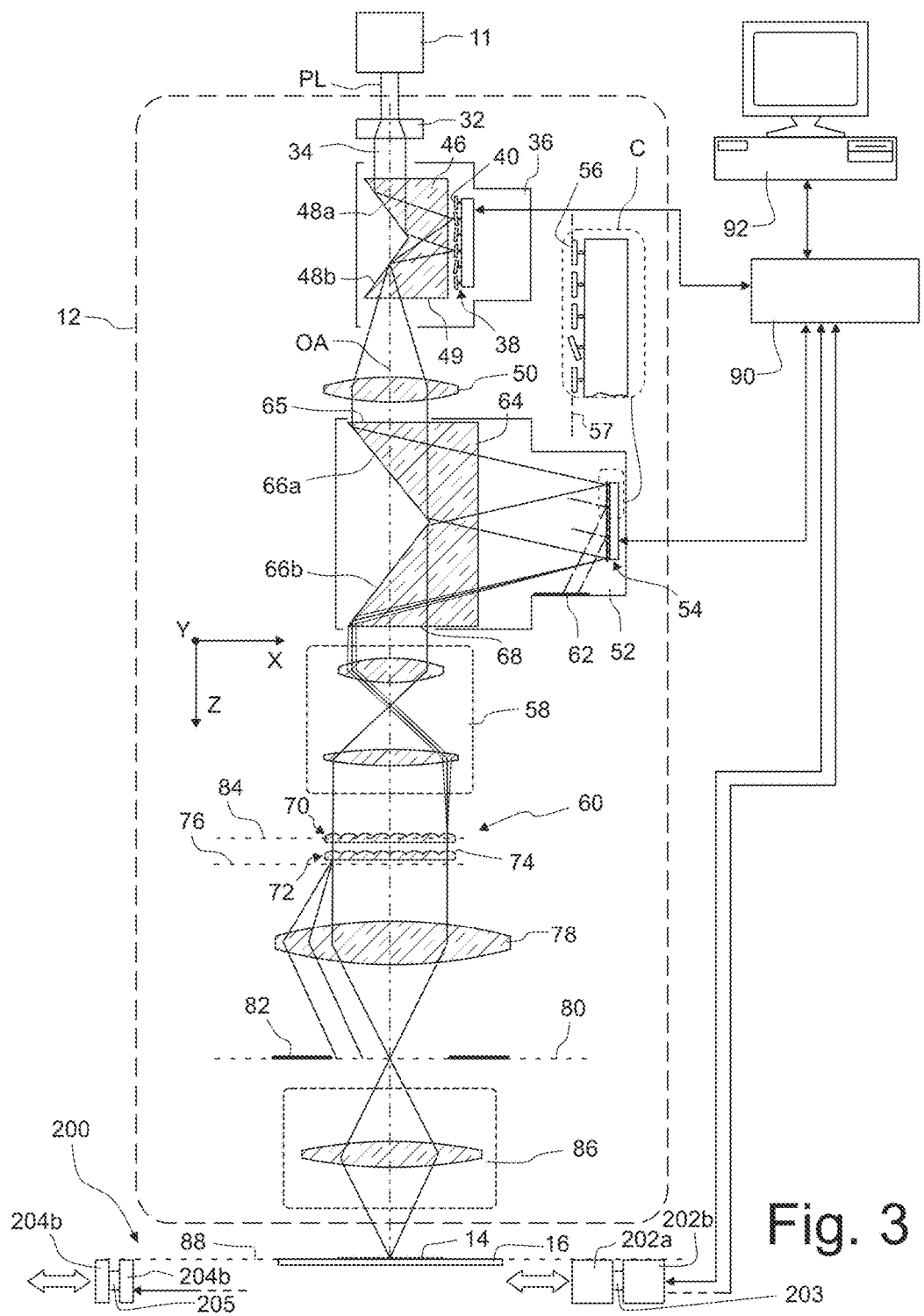
FIG. 3 is a meridional section through an illumination system being part of the apparatus shown in FIG. 1.

FIG. 3 is a meridional section through the illumination system 12 shown in FIG. 1. For the sake of clarity, the illustration of FIG. 3 is considerably simplified and not to scale. This particularly implies that different optical units are represented by one or very few optical elements only. In reality, these units may include significantly more lenses and other optical elements.

In the embodiment shown, the projection light PL emitted by the light source 11 enters a beam expansion unit 32 which outputs an expanded and almost collimated light beam 34. To this end the beam expansion unit 32 may include several lenses or may be realized as a mirror arrangement, for example.

Figure 4:
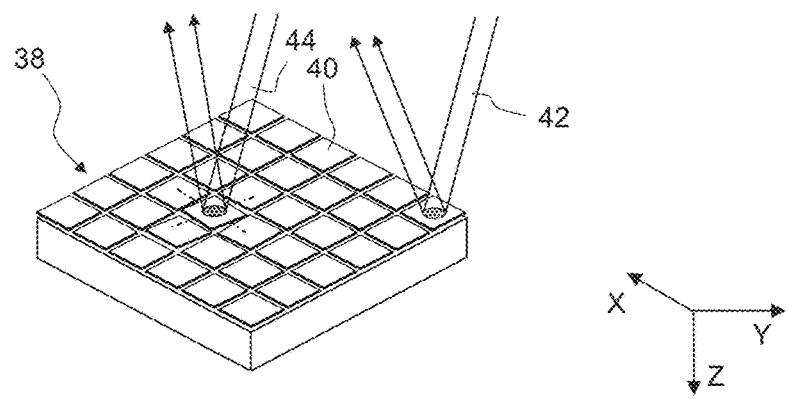
FIG. 4 is a perspective view of a first mirror array contained in the illumination system shown in FIG. 3.

The projection light beam 34 then enters a pupil forming unit 36 that is used to produce variable spatial irradiance distributions in a subsequent plane. To this end the pupil forming unit 36 includes a first mirror array 38 of very small mirrors 40 that can be tilted individually about two orthogonal axes with the help of actuators. FIG. 4 is a perspective view of the first mirror array 38 illustrating how two parallel light beams 42, 44 are reflected into different directions depending on the tilting angles of the mirrors 40 on which the light beams 42, 44 impinge. In FIGS. 3 and 4 the first mirror array 38 includes only 6×6 mirrors 40; in reality the first mirror array 38 may include several hundreds or even several thousands mirrors 40.

The pupil forming unit 36 further includes a prism 46 having a first plane surface 48a and a second plane surface 48b that are both inclined with respect to an optical axis OA of the illumination system 12. At these inclined surfaces 48a, 48b impinging light is reflected by total internal reflection. The first surface 48a reflects the impinging light towards the mirrors 40 of the first mirror array 38, and the second surface 48b directs the light reflected from the mirrors 40 towards an exit surface 49 of the prism 46. The angular irradiance distribution of the light emerging from the exit surface 49 can thus be varied by individually tilting the mirrors 40 of the first mirror array 38. More details with regard to the pupil forming unit 36 can be gleaned from US 2009/0116093 A1.

The angular irradiance distribution produced by the pupil forming unit 36 is transformed into a spatial irradiance distribution with the help of a first condenser 50. The condenser 50, which may be dispensed with in other embodiments, directs the impinging light towards a digital spatial light modulator 52 that is configured to reflect impinging light in a spatially resolved manner. To this end the digital spatial light modulator 52 includes a second mirror array 54 of micromirrors 56 that are arranged in a modulation plane 57 and can be seen best in the enlarged cut-out C of FIG. 3 and the enlarged cut-out C' of FIG. 5. In contrast to the mirrors 40 of the first mirror array 38, however, each micromirror 56 of the second mirror array 54 has only two stable operating states, namely an "on" state, in which it directs impinging light via a first objective 58 towards an optical integrator 60, and an "off" state, in which it directs impinging towards a light absorbing surface 62.

The second mirror array 54 may be realized as a digital mirror device (DMD), as they are commonly used in beamers, for example. Such devices may include up to several million micromirrors that can be switched between the two operating states many thousands times per second.

Similar to the pupil forming unit 36, the spatial light modulator 52 further includes a prism 64 having an entrance surface 65 that is arranged perpendicular to the optical axis OA and a first plane surface 66a and a second plane surface 66b that are both inclined with respect to the optical axis OA of the illumination system 12. At these inclined surfaces 66a, 66b impinging light is reflected by total internal reflection. The first surface 66a reflects the impinging light towards the micromirrors 56 of the second mirror array 54, and the second surface 66b directs the light reflected from the micromirrors 56 towards a surface 68 of the prism 64.

If all micromirrors 56 of the second mirror array 54 are in their "on" state, the second mirror array 54 has substantially the effect of a plane beam folding mirror. However, if one or more micromirrors 56 are switched to their "off" state, the spatial irradiance distribution of the light emerging from the modulation plane 57 is modified. This can be used, in a manner that will be explained in more detail further below (cf. section IV), to produce a field dependent modification of the angular irradiance distribution on the mask 16.

As it already has been mentioned above, the light emerging from the prism 64 passes through the first objective 58 and impinges on the optical integrator 60. Since the light passing through the first objective 58 is almost collimated, the first objective 58 may have a very low numerical aperture (for example 0.01 or even below) and thus can be realized with a few small spherical lenses. The first objective 58 images the modulation plane 57 of the spatial light modulator 52 onto the optical integrator 60.

Figure 6:
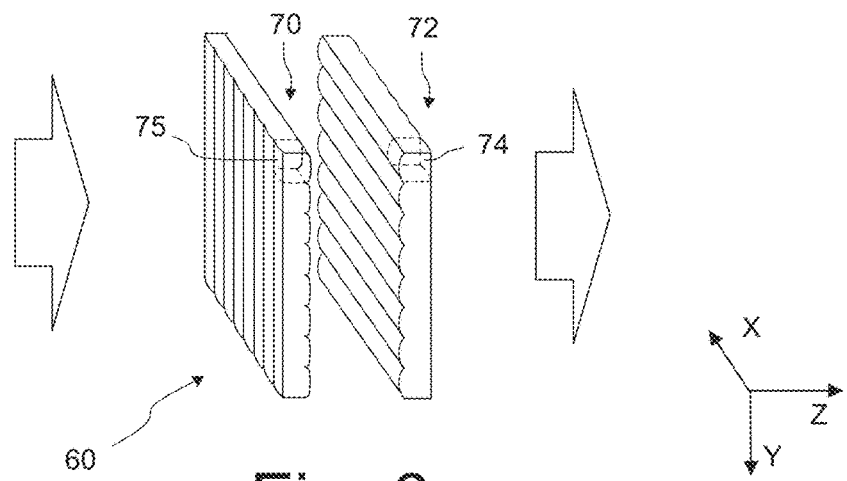
FIG. 6 is a perspective view of an optical integrator contained in the illumination system shown in FIG. 3.

The optical integrator 60 includes, in the embodiment shown, a first array 70 and a second array 72 of optical raster elements 74. FIG. 6 is a perspective view of the two arrays 70, 72. Each array 70, 72 includes, on each side of a support plate, a parallel array of cylinder lenses extending along the X and the Y direction, respectively. The volumes where two cylinder lenses cross form optical raster elements 74. Thus each optical raster element 74 may be regarded as a microlens having cylindrically curved surfaces. The use of cylinder lenses is advantageous particularly in those cases in which the refractive power of the optical raster elements 74 shall be different along the X and the Y direction. A different refractive power is involved if the square irradiance distribution on the optical integrator 60 shall be transformed into a slit-shaped illumination field 14, as this is usually the case. The surface of the optical raster elements 74 pointing towards the spatial light modulator 52 will be referred to in the following as light entrance facet 75.

The optical raster elements 74 of the first and second array 70, 72 respectively, are arranged one behind the other in such a way that one optical raster element 74 of the first array 70 is associated in a one to one correspondence with one optical raster element 74 of the second array 72. The two optical raster elements 74, which are associated with each other, are aligned along a common axis and define an optical channel. Within the optical integrator 60 a light beam which propagates in one optical channel does not cross or superimpose with light beams propagating in other optical channels. Thus the optical channels associated with the optical raster elements 74 are optically isolated from each other.

In this embodiment a pupil plane 76 of the illumination system 12 is located behind the second array 72; however, it may equally be arranged in front of it. A second condenser 78 establishes a Fourier relationship between the pupil plane 76 and a field stop plane 80 in which an adjustable field stop 82 is arranged.

The field stop plane 80 is optically conjugated to a raster field plane 84 which is located within or in close proximity to the light entrance facets 75 of the optical integrator 60. This means that each light entrance facet 75 in the raster field plane 84 is imaged onto the entire field stop plane 80 by the associated optical raster element 74 of the second array 72 and the second condenser 78. The images of the irradiance distribution on the light entrance facet 75 within all optical channels superimpose in the field stop plane 80, which results in its very uniform illumination of the mask 16. Another way of describing the uniform illumination of the mask 16 is based on the irradiance distribution which is produced by each optical channel in the pupil plane 76. This irradiance distribution is often referred to as secondary light source. All secondary light sources commonly illuminate the field stop plane 80 with projection light from different directions. If a secondary light source is "dark", no light impinges on the mask 16 from a (small) range of directions that is associated with this particular light source. Thus it is possible to set the desired angular irradiance distribution on the mask 16 by simply switching on and off the secondary light sources formed in the pupil plane 76. This is accomplished by changing the irradiance distribution on the optical integrator 60 with the help of the pupil forming unit 36.

The field stop plane 80 is imaged by a second objective 86 onto a mask plane 88 in which the mask 16 is arranged with the help of a mask stage (not shown). The adjustable field stop 82 is also imaged on the mask plane 88 and defines at least the short lateral sides of the illumination field 14 extending along the scan direction Y.

The pupil forming unit 36 and the spatial light modulator 52 are connected to a control unit 90 which is, in turn, connected to an overall system control 92 illustrated as a personal computer. The control unit 90 is configured to control the mirrors 40 of the pupil forming unit 36 and the micromirrors 56 of the spatial light modulator 52 in such a manner that the angular irradiance distribution in the mask plane 88 has the intended field dependency. In the following section IV the function and control of the illumination system 12 will be described.

The illumination system further includes a measuring device 200 that is configured to measure the position of the second mirror array 54 and the orientation of its micromirrors 56. In the embodiment shown the measuring device 200 includes two pupil measuring units 202a, 202b that are rigidly connected by a first connecting structure 203 and are configured to measure the angular irradiance distribution simultaneously at two different field point in the mask plane 88.

Additionally, or preferably alternatively, the measuring device 200 includes two irradiance measuring units 204a, 204b that are also rigidly connected by a second connecting structure 205 and are configured to measure the irradiance simultaneously at two different field point in the mask plane 88.

The function of the pupil measuring units 202a, 202b and of the irradiance measuring units 204a, 204b will be explained in more detail further below with reference to FIGS. 16 to 21.

IV. Function and Control of the Illumination System

1. Pupil Forming

Figure 7:
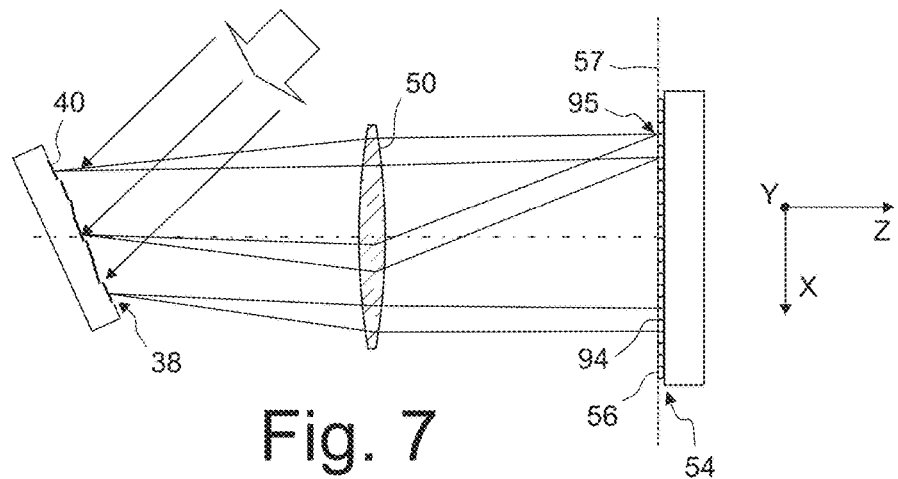
FIG. 7 is a schematic meridional section through the first and the second mirror array shown in FIGS. 4 and 5.

FIG. 7 schematically illustrates how the pupil forming unit 36 produces an irradiance distribution on the micromirrors 56 of the spatial light modulator 52. For the sake of simplicity the prisms 46, 64 are not shown.

Each mirror 40 of the first mirror array 38 is configured to illuminate a spot 94 on the modulation plane 57 of the spatial light modulator 52 at a position that is variable by changing a deflection angle produced by the respective mirror 40. Thus the spots 94 can be freely moved over the modulation plane 57 by tilting the mirrors 40 around their tilt axes. In this way it is possible to produce a wide variety of different irradiance distributions on the modulation plane 57.

The spots 94 may also partly or completely overlap, as this is shown at 95. Then also graded irradiance distributions may be produced.

Figure 5:
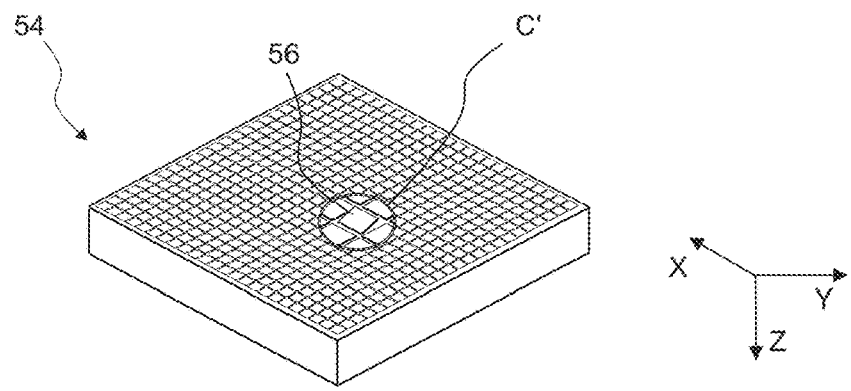
FIG. 5 is a perspective view of a second mirror array contained in the illumination system shown in FIG. 3.
Figure 8:
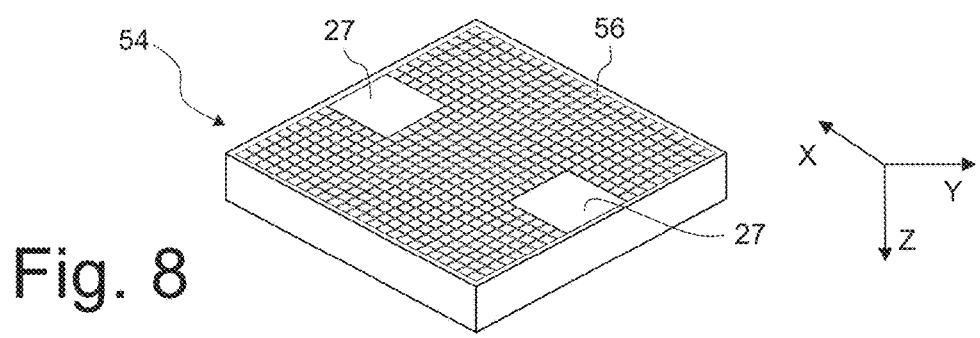
FIG. 8 is a perspective view on the second mirror array shown in FIG. 5, but illuminated with two poles.

FIG. 8 is a perspective view, similar to FIG. 5, on the second mirror array 54 contained in the spatial light modulator 52. Here it is assumed that the pupil forming unit 36 has produced an irradiance distribution on the second mirror array 54 that consists of two square poles 27 each extending exactly over 66 micromirrors 56. The poles 27 are arranged point-symmetrically along the X direction.

Figure 9:
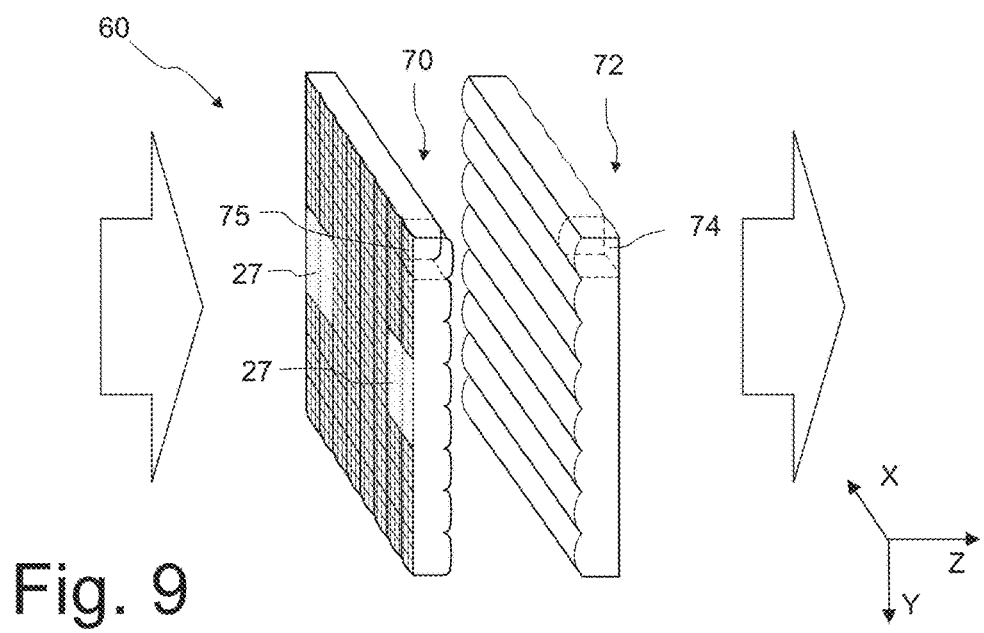
FIG. 9 is a perspective view of the optical integrator shown in FIG. 6, but illuminated with two poles.

The objective 58 forms an image of this irradiance distribution on the light entrance facets 75 of the optical integrator 60, as this is shown in FIG. 9. Here it is assumed that all micromirrors 56 are in the "on"-state so that the irradiance distribution formed on the second mirror array 54 is identically reproduced (apart from a possible scaling due to a magnification of the objective 58) on the light entrance facets 75 of the optical integrator 60. The regular grid shown on the light entrance facets 75 represent an image of the borderlines of the micromirrors 56, but this image does not appear outside the poles 27 and is shown in FIG. 9 for illustrative reasons only.

2. Field Dependency

Since the light entrance facets 75 are located in the raster field plane 84, the irradiance distribution on the light entrance facets 75 is imaged, via the optical raster elements 74 of the second array 72 and the second condenser 78, on the field stop plane 80.

This will now be explained with reference to FIG. 10 which is an enlarged and not to scale cut-out from FIG. 3. Here only two pairs of optical raster elements 74 of the optical integrator 60, the second condenser 78 and the intermediate field stop plane 80 are shown schematically.

Two optical raster elements 74 that are associated with a single optical channel are referred to in the following as first microlens 101 and second microlens 102. The microlenses 101, 102 are sometimes referred to as field and pupil honeycomb lenses. Each pair of microlenses 101, 102 associated with a particular optical channel produces a secondary light source 106 in the pupil plane 76. In the upper half of FIG. 10 it is assumed that converging light bundles L1$a$, L2$a$ and L3$a$ illustrated with solid, dotted and broken lines, respectively, impinge on different points of the light entrance facet 75 of the first microlens 101. After having passed the two microlenses 101, 102 and the condenser 78, each light bundle L1$a$, L2$a$ and L3$a$ converges to a focal point F1, F2 and F3, respectively. From the upper half of FIG. 10 it becomes clear that points, where light rays impinge on the light entrance facet 75, and points where these light rays pass the field stop plane 80 (or any other conjugated field plane), are optically conjugate.

Figure 10:
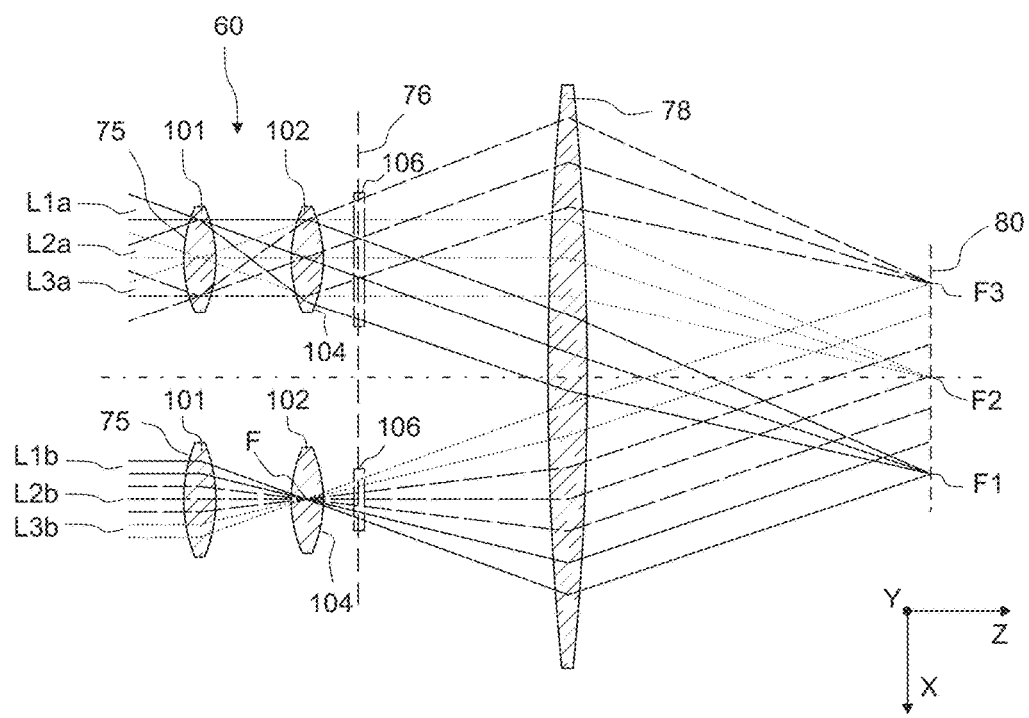
FIG. 10 is a schematic meridional section through a portion of the illumination system in which only a mirror array, a condenser and an array of optical raster elements are shown.

The lower half of FIG. 10 illustrates the case when collimated light bundles L1$b$, L2$b$ and L3$b$ impinge on different regions of the light entrance facet 75 of the first microlens 101. This is the more realistic case because the light impinging on the optical integrator 60 is usually substantially collimated. The light bundles L1$b$, L2$b$ and L3$b$ are focused in a common focal point F located in the second microlens 102 and then pass, now collimated again, the field stop plane 80. Again it can be seen that, as a result of the optical conjugation, the region where a light bundle L1$b$, L2$b$ and L3$b$ impinges on the light entrance facet 75 corresponds to the region which is illuminated in the field stop plane 80. As a matter of course, these considerations apply separately for the X and the Y direction if the microlenses 101, 102 have refractive power both along the X and Y direction.

Therefore each point on a light entrance facet 75 directly corresponds to a conjugated point in the intermediate field stop plane 80 (and hence in the illumination field 14 on the mask 16). If it is possible to selectively influence the irradiance on a point on a light entrance facet 75, it is thus possible to influence the irradiance of a light ray that impinges on the conjugated point in the illumination field 14 from a direction that depends on the position of the light entrance facet 75 with respect to the optical axis OA of the illumination system. The larger the distance between the light entrance facet 75 from the optical axis OA is, the larger is the angle under which the light ray impinges on the point on the mask 16.

3. Modifying Irradiance on Light Entrance Facets

In the illumination system 12 the spatial light modulator 52 is used to modify the irradiance on points on the light entrance facets 75. In FIG. 9 it can be seen that each pole 27 extends over a plurality of small areas that are images of the micromirrors 56. If a micromirror is brought into an "off" state, the conjugated area on the light entrance facet 75 will not be illuminated, and consequently no projection light will impinge on a conjugated area on the mask from the (small) range of directions that is associated with this particular light entrance facet 75.

This will be explained in more detail with reference to FIGS. 11A and 11B which are top views on the micromirrors 56 of the spatial light modulator 52 and on the light entrance facets 75 of the optical integrator 60, respectively.

The thick dotted lines on the second mirror array 54 divide its modulation plane 57 into a plurality of object areas 110 each including 3×3 micromirrors 56. The objective 58 forms an image of each object area 110 on the optical integrator 60. This image will be referred to in the following as image area 110'. Each image area 110' completely coincides with a light entrance facet 75, i.e. the image areas 110' have the same shape, size and orientation as the light entrance facets 75 and are completely superimposed on the latter. Since each object area 110 includes 3×3 micromirrors 56, the image areas 110' also include 3×3 images 56' of micromirrors 56.

Figures 11A, 11B:
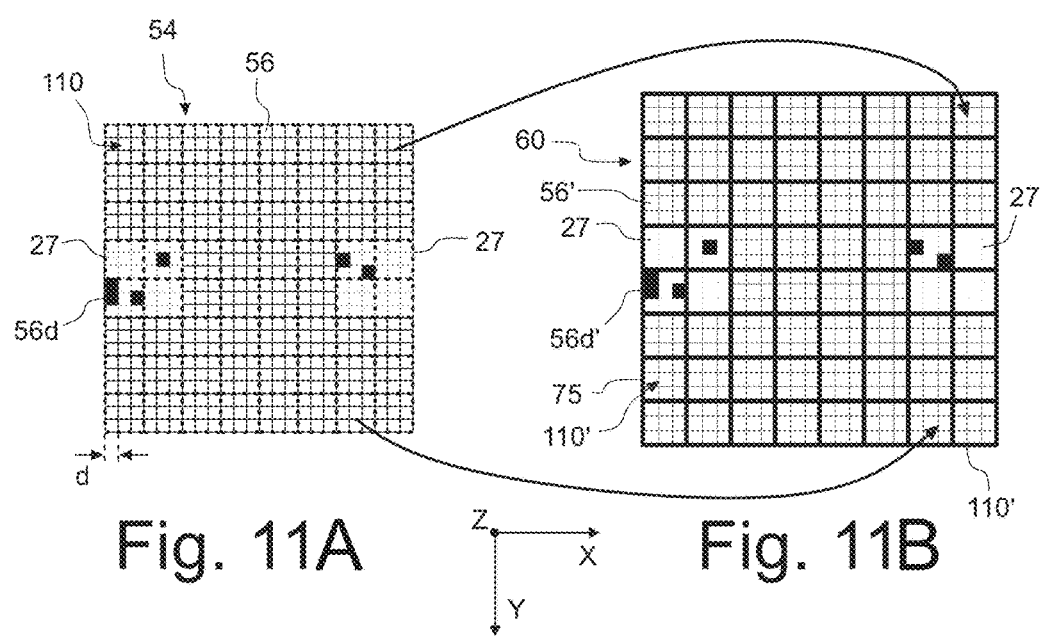
FIGS. 11A and 11B are top views on the second mirror array and the optical integrator shown in FIG. 3.

In FIG. 11A there are eight object areas 110 that are completely illuminated by the pupil forming unit 36 with projection light. These eight object areas 110 form the two poles 27. It can be seen that in some of the object areas 110 one, two or more micromirrors 56$d$ represented as black squares have been controlled by the control unit 90 such that they are in an "off"-state in which impinging projection light is not directed towards the objective 58, but towards the light absorbing surface 62. By switching micromirrors between the "on" and the "off" state it is thus possible to variably prevent projection light from impinging on corresponding regions within the image areas 110' on the light entrance facets 75, as this is shown in FIG. 11B. These regions will be referred to in the following as dark spots 56$d'$.

As has been explained above with reference to FIG. 10, the irradiance distribution on the light entrance facets 75 is imaged on the field stop plane 80. If a light entrance facet 75 contains one or more dark spots 56$d'$, as this is illustrated in the upper portion of FIG. 12, the irradiance distribution produced in the mask plane 88 by the associated optical channel will have dark spots at certain X positions, too. If a point on a mask passes through the illumination field 14, the total scan integrated irradiance will thus depend on the X position of the point in the illumination field 14, as this is shown in the graph of FIG. 13. Points in the middle of the illumination field 14 will experience the highest scan integrated irradiance, because they do not pass through dark spots, and points at the longitudinal ends of the illumination field 14 will receive total irradiances that are reduced to different extents. Thus the field dependency of the angular irradiance distribution on the mask 16 and also the spatial irradiance distribution can be modified by selectively bringing one or more micromirrors 56 of the spatial light modulator 52 from an "on"-state into the "off"-state.

In a foregoing it has to be assumed that each object area 110, which is imaged on one of the light entrance facets 75, contains only 3×3 micromirrors 56. Thus the resolution along the cross-scan direction X that can be used to modify the field dependency of the angular irradiance distribution is relatively coarse. If the number of micromirrors 56 within each object area 110 is increased, this resolution can be improved.

FIG. 14 illustrates a top view on one of the light entrance facets 75 for an embodiment in which 20×20 micromirrors 56 are contained in each object area 110. Then more complicated scan integrated irradiance distributions along the X direction can be achieved on the mask 16, as this is illustrated in the graph shown in FIG. 15.

V. Measuring the Position and Orientation of the Micromirrors

The ability of the illumination system 12 to produce an angular irradiance distribution in a field dependent manner crucially depends on an accurate imaging of the second mirror array 54 on the optical integrator 60 in the manner illustrated in FIGS. 11A and 11B. As expressed further above, the image areas 110' have to cover exactly one light entrance facet 75 of the optical integrator 60. Otherwise the field dependency of the angular irradiance distribution obtained in the mask plane 88 will deviate significantly from what is intended. For example, if a micromirror 56 is imaged not on the intended, but on the adjoining light entrance facet 75, it will finally be imaged on the opposite side of the illumination field 14. Thus a minute shift of an image area 110' may translate into a shift of light energy to a very distant portion of the illumination field 14.

If the second mirror array 54 of the digital spatial light modulator 52 performs, during the operation of the illumination system 12, minute drift movements relative to the optical integrator 60, the proper imaging illustrated in FIGS. 11A and 11B will usually be disturbed. For example, if the entire mirror array 54 shown in FIG. 11A drifts along the +X direction by a distance d which is assumed to be equal to the width of one micromirror 56 (see FIG. 11A), the poles 27 illuminated on the mirror array 54 will cover one or more "wrong" micromirrors 56, for example micromirrors that are in the "off" state.

Similar considerations also apply if a micromirror 56 does not reflect the impinging reflection light into the desired direction. This may happen if the micromirror 56 is stuck in one of the tilting positions, for example, or if its reflective coating forming the mirror surface has been damaged by the high energy projection light.

In the following different approaches will be described how the position and/or the orientation of the micromirrors 56 can be efficiently measured.

1. Pupil Measurement

Figure 16:
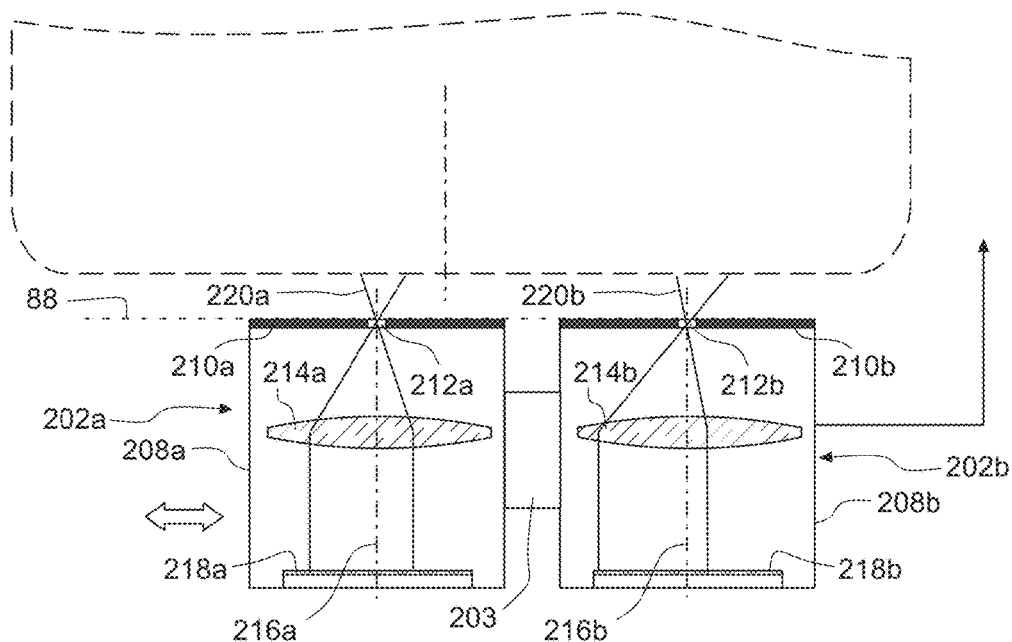
FIG. 16 is an enlarged cutout from FIG. 3 illustrating two pupil measuring units that measure the pupil (i.e. angular irradiance distribution) in the mask plane of the illumination system.

FIG. 16 is an enlarged schematic cutout from the bottom portion of the illumination system 12. The illumination system 12 is shown in a measuring state in which the mask 16 has been removed and the two pupil measuring units 202a, 202b of the measuring device 200 shown in FIG. 3 have been moved into a measuring position with the help of a drive (not shown).

Each pupil measuring unit 202a, 202b includes a housing 208a, 208b having a cover that is formed by a diaphragm 210a, 210b that has a central pinhole 212a, 212b. The pinholes 212a, 212b are arranged exactly in the mask plane 88 of the illumination system 12.

Each housing 208a, 208b contains a condenser 214a, 214b having a focal plane that coincides with the mask plane 88. Thus light entering the housing 208a, 208b through the pinhole 212a, 212b leaves the condenser 214a, 214b as collimated light, i.e. light that propagates parallel to the optical axis 216a, 216b of the pupil measurement units 202a, 202b.

The collimated light impinges on a position resolving light sensor 218a, 218b that may be formed by a CCD chip, for example. Since the angles of incidence of the projection light rays 220a, 220b in the mask plane 88 translate into positions in the Fourier related plane of the position resolving light sensor 218a, 218b, the latter effectively detects the angular irradiance distribution of the projection light rays 220a, 220b at the position of the pin hole 212a, 212b.

The position resolving light sensors 218a, 218b are connected to the control unit 90 (see FIG. 3) which computes, from the spatial irradiance distribution measured in the plane of the position resolving light sensors 218a, 218b, the angular irradiance distribution of the projection light rays 220a, 220b in the mask plane 88. Since two pupil measuring units 202a, 202b are provided, it is possible to measure the angular irradiance distribution in the mask plane 88 simultaneously at two different field positions. By accurately displacing the two pupil measuring units 202a, 202b, which are connected by the connecting structure 203, parallel to the mask plane 88, it is possible to quickly measure the angular irradiance distribution at a large number of different field points in a short time. As a matter of course, also more than two, for example nine pupil measuring units may be combined so that a correspondingly large number of measurements can be performed simultaneously. This reduces the time that to measure the angular irradiance distributions at a number of field points being equal to the number of micromirrors 56 in each one object area 110 that is completely imaged on one light entrance facet 75.

Figure 18A:
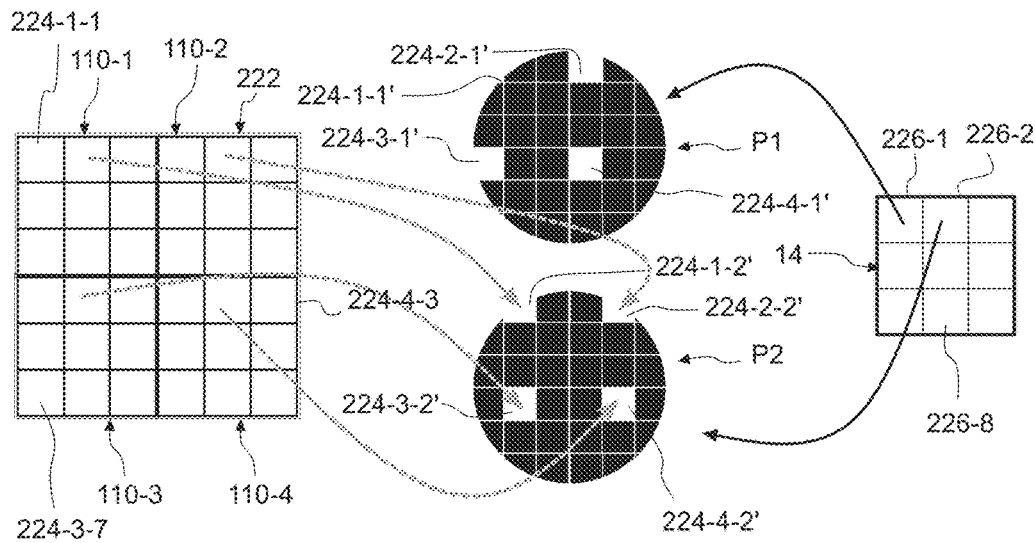
FIGS. 18A and 18B illustrate how the orientation of mirror surfaces can be determined with the help of the pupil measuring units shown in FIG. 16.

In the following it will be described with reference to FIGS. 17 and 18A-18B how the pupil measuring unit 202a, 202b can be used to measure the position and the orientation of the mirror surfaces of the micromirrors 56.

FIG. 17 shows on the left hand side 4 object areas 110-1 to 110-4 of the spatial light modulator 52 that are delimited by triple lines for the sake of illustration. The first object area 110-1 includes 3×3 mirror surfaces 224-1-1 to 224-1-9, the second object area 110-2 3×3 mirror surfaces 224-2-1 to 224-2-9, and so on. Here it is assumed that the micromirrors 56 are controlled such that a chessboard-like light pattern is produced in a modulation surface 222 that is formed by all mirror surfaces 224. The light pattern produced in each object area 110-1 to 110-4 is imaged on one light entrance facet 75 of the optical integrator 60. For the sake of simplicity it is assumed that the total number of light entrance facets 75 is only 4; in reality this number may be much larger, for example between $10^2$ and $10^6$.

At the right hand side of FIG. 17 the illumination field 14 (here assumed to have a square shape) is schematically illustrated. Because each object area 100 includes 3×3 mirror surfaces 224 that are imaged on one light entrance facet 75, and because the latter is then imaged on the entire illumination field 14, 9 image areas 226-1 to 226-9 are formed in the illumination field 14. Since the images of the light entrance facets 75 superimpose in the mask plane 88, at each image area 226-1 to 226-9 images of 4 mirror surfaces superimpose. For example, at the first image area 226-1 the images of the mirror surfaces 224-1-1, 224-2-1, 224-3-1 and 224-4-1 superimpose. Similarly, only the mirror surfaces 224-1-2, 224-2-2, 224-3-2 and 224-4-2 of each object area 110-1 to 110-4 contribute to the illumination of the second image area 226-2, and so on.

In the middle portion of FIG. 17 the pupils P1 and P2 of light bundles that converge to a point in the image areas 226-1 and 226-2, respectively, are schematically illustrated. The pupil of each light bundle is determined by the irradiance distribution on the optical integrator 60 that is produced by the spatial light modulator 52. The irradiance distribution on the optical integrator 60 is an image of the chessboard-like pattern shown on the left hand side of FIG. 17.

On the left hand side of FIG. 17 it can be seen that from the four mirror surfaces 224-1-1, 224-2-1, 224-3-1 and 224-4-1 that are imaged on the first image area 226-1, the two mirror surfaces 224-1-1 and 224-4-1 are in an "off"-state illustrated by black color, and two mirror surfaces 224-2-1 and 224-3-1 are in an "on" state which is illustrated by white color. Thus only the two mirror surfaces 224-2-1 and 224-3-1, from which arrows indicated with dotted lines start, in fact illuminate the first image area 226-1. In the pupil P1 of the light bundles that form the first image area 226-1, the images of these two illuminated mirror surfaces 224-2-1 and 224-3-1 on the optical integrator 60 can be seen.

Thus, if one of the pupil measuring units 202a, 202b is positioned underneath the illumination system 12 so that its pinhole 212a, 212b is within the first image area 226-1, its position resolving light sensors 218a, 218b will detect an irradiance distribution which corresponds to the pupil P1 shown in the middle portion of FIG. 17. As a matter of course, the white lines in the pupil P1 are shown here only for illustrative purposes; in reality the pupil P1 will be completely dark with the exception of the two illuminated regions 224-2-1' and 224-3-1' that are images of the mirror surfaces 224-2-1 and 224-3-1.

If the modulation surface 222 is laterally displaced as a result of a drift movement of the entire mirror array 54, also the illuminated regions 224-2-1' and 224-3-1' will be displaced in the pupil P1 that is measured by the position resolving light sensor 202a or 202b. Therefore it is possible to compute, on the basis of the position of the illuminated regions 224-2-1' and 224-3-1' that are detected on the position resolving light sensors 218a, 218b, where the mirror surfaces 224 of the spatial light modulator 52 are located. In this computation other quantities, in particular the shape of the mirror surfaces 224, the spatial arrangement of the modulation surface 222 relative to the light entrance facets 75, and the shape of the light entrance facets 75 usually have to be taken into account.

Since drift movements between adjacent mirror surfaces 224 are unlikely to occur to an extent that is significant, usually it suffices to measure the irradiance distribution only at one field point in the mask plane 88. If drift movement occur between mirror surfaces 224 within a single object area 110-1 to 110-4, it might be desirable to perform the measurement of the angular irradiance distribution at a larger number of field points.

The pupil P2 associated with light bundles that converge to a point in second image area 226-2 is also shown in the middle portion of FIG. 17. It can be seen that the location of the illuminated regions 224-1-2' and 224-4-2' have changed, because now only the mirror surfaces 224-1-2 and 224-4-2 contribute to the illumination of the second image area 226-2. If needed, the pupils associated with all 9 image areas 226-1 to 226-9 can be measured in this way.

It is also possible to measure whether the mirror surfaces 224 contributing to the illumination of the image areas 226-to 226-9 have the desired orientation. For example, if the mirror surface 224-2-1 is assumed to be stuck in an "off" state, it would be dark, and correspondingly the illuminated region 224-2-1' in the first pupil P1 would be missing. Thus, with a measurement of the angular irradiance distribution at one field point within the first image area 226-1 it is possible to measure not only the position, but also the orientation of all four mirror surfaces 224-1-1, 224-2-1, 224-3-1 and 224-4-1 that are imaged on the first image area 226-1. If the orientation of all mirror surfaces 224 shall be measured, it is desirable to perform the measurement of the angular irradiance distribution for all nine image areas 226-1 to 226-9.

From FIG. 17 it also becomes clear why the chessboard-like irradiance distribution produced by the pupil forming unit 36 on the modulation surface 222 is advantageous. Even if the images of individual mirror surfaces 224 on the optical integrator 60 are blurred due to diffraction and aberrations, the illuminated regions 224-2-1', 224-3-1', 224-1-2' and 224-4-2' are still spaced apart from each other by distances that ensure that they can be properly and accurately detected by the position resolving light sensors 218a, 218b.

As a matter of course, also other light patterns may be formed on the modulation surface 222. Even if all mirror surfaces of the modulation surface 222 are in the "on" state, the illuminated regions in the pupils P1, P2 cannot overlap, but then the distance between these regions becomes somewhat smaller, as this is illustrated in FIG. 18A. Then in each pupil P1, P2 there are not only two, but four illuminated regions 224-1-1', 224-2-1', 224-3-1', 224-4-1' and 224-1-2', 224-2-2', 224-3-2', 224-4-2'.

Figure 18B:
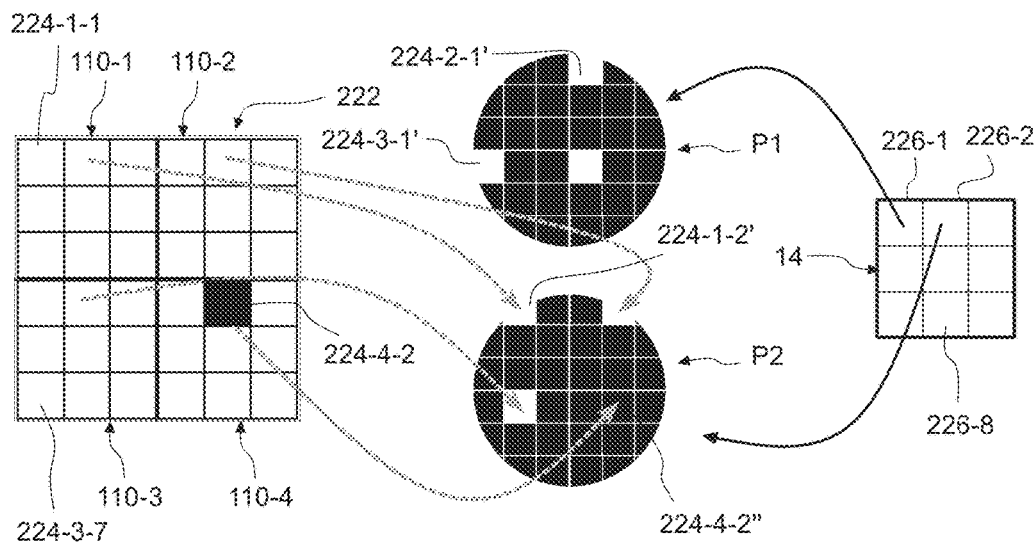

In FIG. 18B it is assumed that one mirror surface 224-4-2 is damaged. This can be detected by measuring the angular irradiance distribution at a field point in the second image area 226-2. In the pupil P2 associated with this field point and measured by the position resolving light sensor 218a, 218b this can be detected by a black spot at a region 224-4-2" on which the damaged mirror surface 224-4-2 is imaged.

2. Field Measurement

Instead of, or in addition to, the measurement of the angular irradiance distribution at one or more points in the illumination field 14, only the irradiance may be measured.

Figure 19:
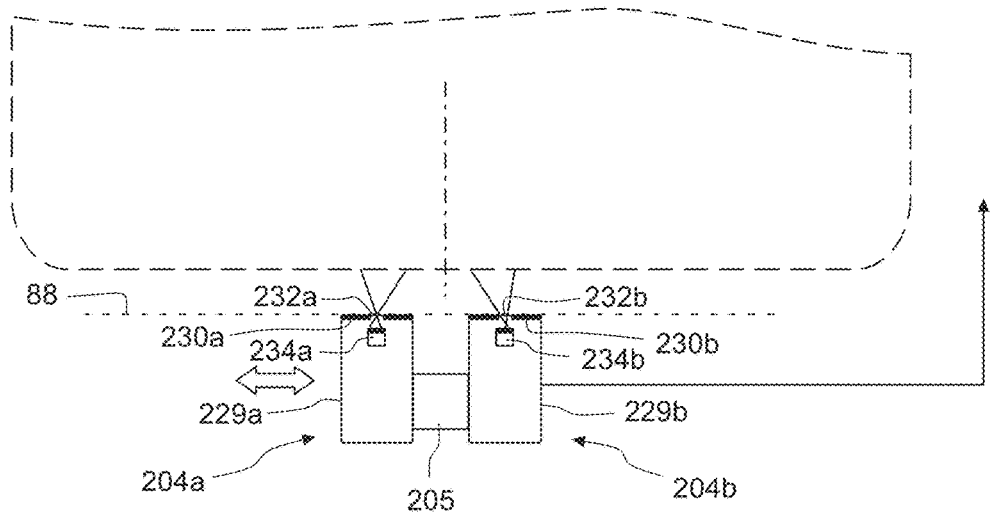
FIG. 19 is an enlarged cutout from FIG. 3 illustrating two irradiance sensors that measure the irradiance in the mask plane.

FIG. 19 is the same illustration enlarged schematic cutout from the bottom portion of the illumination system 12 as FIG. 16. However, here the two pupil measuring units 202a, 202b have been brought into a parking position, and the two irradiance measuring units 204a, 204b briefly mentioned above with reference to FIG. 3 are now in their measuring position.

Each irradiance measuring unit 204a, 204b includes a housing 229a, 229b including a diaphragm 230a, 230b that contains a small pinhole 232a, 232b. Each irradiance measuring unit 204a, 204b further includes a light sensor 234a, 234b that measures the irradiance of the light that has passed through the pinholes 232a, 232b. The light sensor 234a, 234b is not position resolving and thus integrates the irradiance for all angles of incidence. Therefore each light sensor 234a, 234b detects the total irradiance in the mask plane 88 at the position of the pinhole 232a, 232b.

Figure 20:
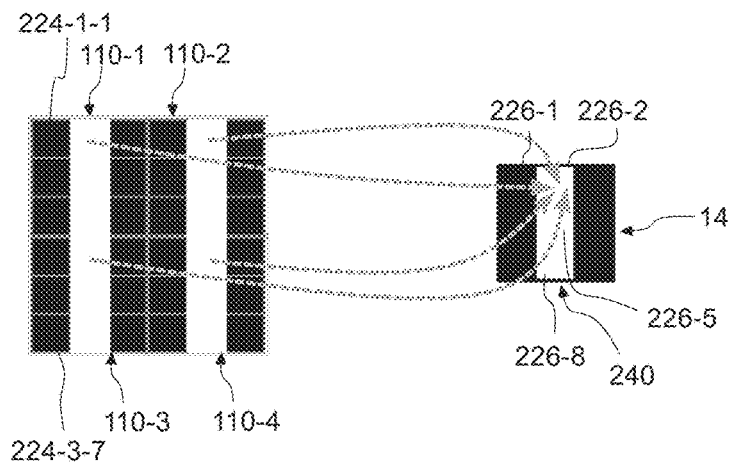
FIG. 20 illustrates how the irradiance measurement at different field positions provides information with regard to the position and the orientation of mirror surfaces.

FIG. 20 illustrates how relative drift movements between the spatial light modulator 52 and the optical integrator 60 can be measured with the help of the irradiance measuring units 204a, 204b. It is assumed that the spatial light modulator 52 is controlled in such manner that an illuminated stripe 240 consisting of the image areas 226-1, 226-5 and 226-8 is produced in the illuminated field 14. This involves having the mirror surfaces 224 in the middle columns of all four object areas 110-1 to 110-4 are in the "on" state and all other mirror surfaces 224 are in the "off" state.

The position of the stripe 240 is accurately measured with the help of the irradiance measuring units 204a, 204b. If the relative position between the spatial light modulator 52 and the optical integrator 60 changes, the position of the stripe 240 in the mask plane 88 changes correspondingly. Therefore, it is possible, by measuring a light pattern in the mask plane 88 with the help of the irradiance measuring unit 204a, 204b, to compute a change of the relative position between the spatial light modulator 52 and the optical integrator 60.

If only the micromirrors of one object area are in the "on" state, it is possible to measure relative drift movements between the object areas 110-1 to 110-4.

The irradiance measuring units 204a, 204b can also be used to measure the orientation of the mirror surfaces 224. This is illustrated in FIGS. 21A to 21D that show on the left hand side the light patterns produced on the modulation surface 222 and on the right hand side the irradiance distribution in the mask plane 88 that is measured by the irradiance measuring units 204a, 204b.

Figure 21A:
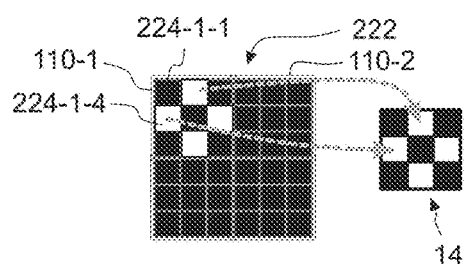
FIG. 21A to 21D illustrate how the orientations of mirror surfaces can be determined with the help of the irradiance measuring units shown in FIG. 19.

In FIG. 21A it is illustrated how a particular irradiance distribution is produced on the object area 110-1 and thus on the light entrance facet 75 on which the object area 110-1 is imaged. All other light entrance facets 75 are not illuminated. Therefore the irradiance distribution measured in the illumination field 14 directly corresponds to the light pattern shown on the right hand side of FIG. 21A.

Figure 21B:
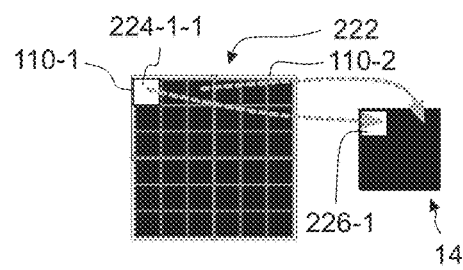

The measurement may be performed in the following manner:

One of the irradiance measuring units 204a, 204b is positioned such that its pinhole 232a, 232b is within the first image area 226-1. The mirror surface 224-1-1 is brought into the "on" state and all other mirror surfaces are brought into the "off" state, as this is shown in FIG. 21B. If the mirror surface 224-1-1 functions properly, the irradiance measuring unit 204a will detect the full irradiance. If the tilting angle is not correct, or the reflective coating is damaged, only a reduced amount of projection light will impinge on the irradiance measuring unit 204a, 204b.

Figure 21C:
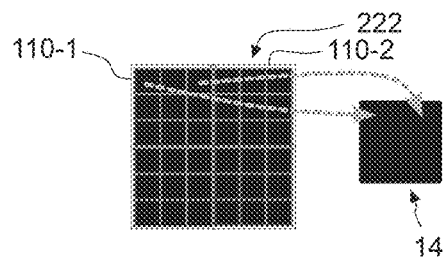
Figure 21D:
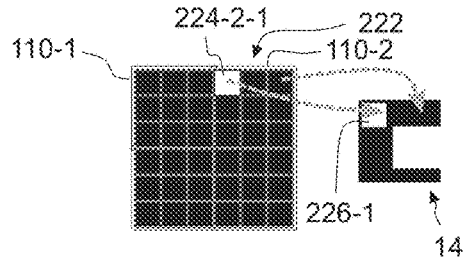

Then the mirror surface 224-1-1 is brought into the "off" state as well. No irradiance should now be detected by the irradiance measuring units 204a, 204b, as this is shown in FIG. 21C.

In a next step, the mirror surface 224-2-1 from the adjoining object area 110-2 is brought into the "on" state. The irradiance measuring unit 204a, 204b, which is still at the same position as before, should now detect the full irradiance, because also the mirror surface 224-2-1 is imaged on the first image area 226-1. Then the mirror surface 224-2-1 is brought into the "off" state, and the irradiance measuring unit 204a, 20b should detect no light.

These steps are repeated until the orientation of all four mirror surfaces 224 that are imaged on the first image area 226-1 has been measured. Then the irradiance measuring unit 204a, 204b moves to a next measuring point in the second image area 226-2. Now the four mirror surfaces 224-1-2, 224-2-2, 224-3-2 and 224-4-2, which are imaged on the second image area 226-12, are successively brought from an "off" state to an "on" state. Since the switching of the mirror surfaces 224 is quite fast, the measurements for each image area 226-1 to 226-9 can be completed very quickly. In total the irradiance measuring unit 204a, 204b has to be displaced N=9 times, wherein N is the number of mirror surfaces 224 that are imaged on one light entrance facet 75. Since the measuring device includes two irradiance measuring units 204a, 204b, the measuring time can be reduced by approximately 50%.

3. Marker Points

Another approach for measuring the absolute position of the mirror array 54 of the spatial light modulator 52 involves the use of one or more marker points that are fixedly arranged directly on the spatial light modulator 52 or a structure that is rigidly fixed to the spatial light modulator 52.

a) Marker Points on Back Side of Micromirror Array

Figure 22:
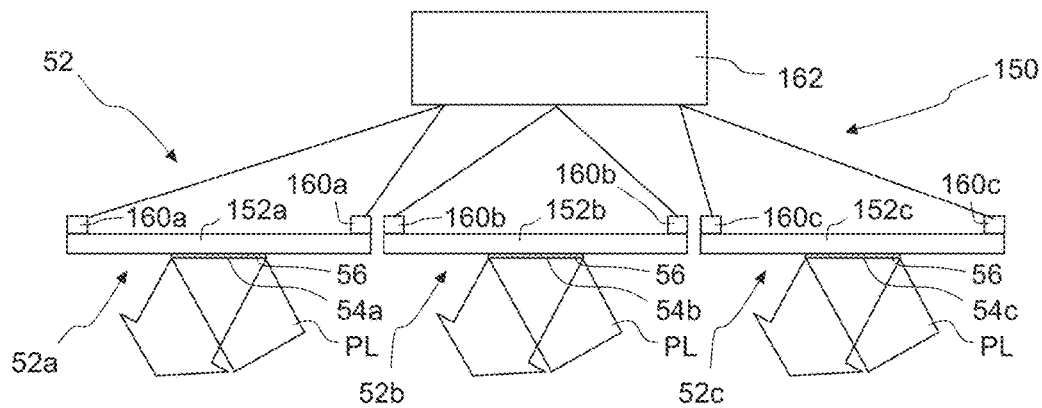
FIG. 22 is a schematic cross-section through a measuring device according to an embodiment in which the positions of marker points are used to measure the relative position between three modulator units.

FIG. 22 is a schematic cross-section through an embodiment of a spatial light modulator 52 that includes three modulator units 52a, 52b and 52c. Each modulator unit 52a, 52b, 52c includes a support 152a, 152b, 152c that supports a digital micromirror array 54a, 54b, 54c. The micromirror arrays 54a, 54b, 54c are configured to deflect impinging projection light PL towards two different directions, namely a first direction along which the projection light travels towards the optical integrator 60, and a second direction along which the projection light travels towards the light absorbing surface 62, depending on whether the micromirrors 56 are in the "on" or in the "off" position.

Even if the support plates 152a, 152b, 152c are connected to a common support structure (not shown), the support plates 152a, 152b, 152c may perform minute drift movements during operation of the illumination system 12. These drift movements may be caused by the thermal expansion of elements contained in the illumination system 12. As explained further above, such drift movements may severely compromise the field dependency of the angular irradiance distribution if no counter-measures are taken.

The illumination system 12 therefore includes a measuring device 150 which includes, in the embodiment shown, three pairs of marker points 160a, 160b, 160c which are fixedly arranged on the back side of the support plates 152a, 152b, 152c, i.e. on the side which is opposite the micromirror array 54a, 54b, 54c. The measuring device 150 further includes a detector 162 which is configured to accurately detect the position of the marker points 160a, 160b, 160c. There is a wide variety of measuring principles that may be used to this end. For example, the detector 162 may emit a light beam that is reflected from the marker points 160a, 160b, 160c, and the distance information is encoded in the wavelength or the phase of the reflected light. Since position measuring systems are known in the art as such, they will not be described in further detail here.

By measuring the position of each marker point 160a, 160b, 160c, the detector 162 can accurately detect even the slightest drift movements of the support plates 152a, 152b, 152c to which the micromirror arrays 54a, 54b, 54c are fixedly attached. In this manner the position of the micromirrors 56 of the micromirror arrays 54a, 54b, 54c can be commonly measured.

b) Marker Points on Front Side

Figure 23:
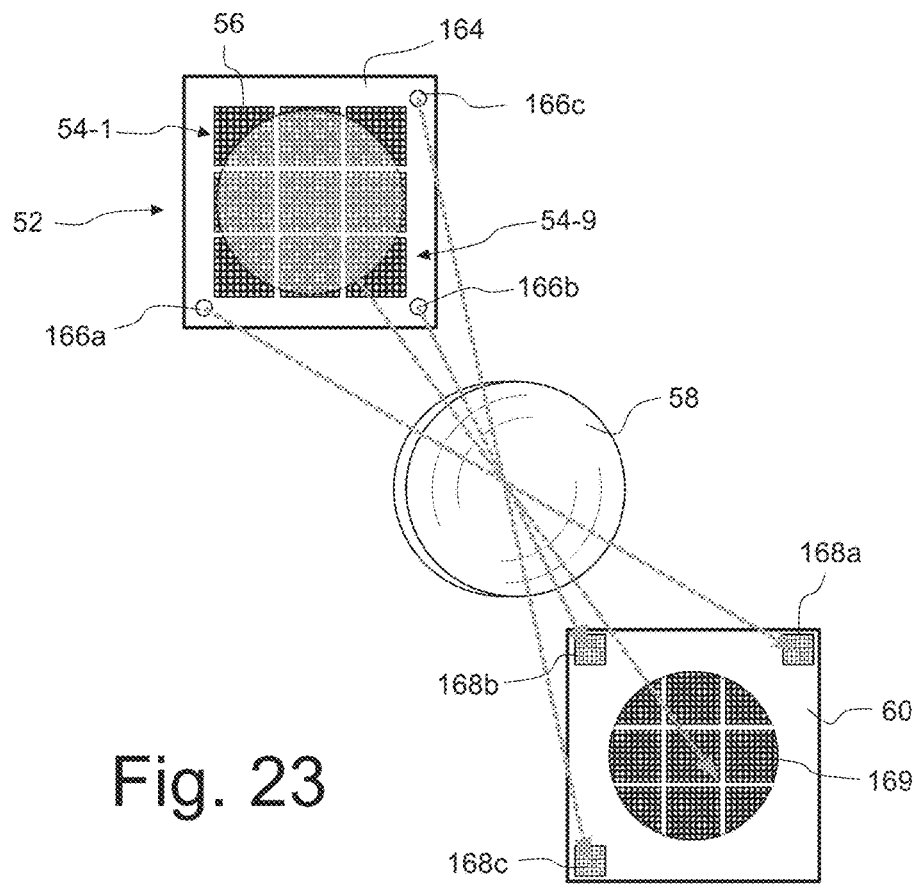
FIG. 23 is a perspective schematic view on a measuring device according to an embodiment in which marker points on the spatial light modulator are imaged on detectors located on the optical integrator.

FIG. 23 schematically illustrates an embodiment in which a common board 164 supports on its front side a plurality of micromirror arrays 54-1 to 54-9 and three marker points 166a to 166c. The marker points 166a to 166c are formed by laser diodes or similar light emitting elements and are part of the measuring device 150. The latter further includes three position resolving light detectors 168a, 168b, 168c that are attached to a front surface of the optical integrator 60 outside the circular region 169 on which projection light impinges.

The arrangement of the three marker points 166a, 166b, 166c is imaged by the first objective 58, together with the micromirror arrays 54-1 to 54-9 of the spatial light modulator 52, on the optical integrator 60 so that the images of the marker points 166a, 166b, 166c lie within the position resolving light detectors 168a, 168b and 168c, respectively.

If the relative position between the board 164 of the spatial light modulator 52 and the optical integrator 60 changes as a result of minute drift movements, the images of the marker points 166a, 166b, 166c move over the position resolving light detectors 168a, 168b, 168c. By carefully analyzing the position changes of the images of the marker points 166a, 166b, 166c on the position resolving light detectors 168a, 168b, 168c, it is possible to measure arbitrary movements of the board 164 in all six degrees of freedom.

4. Measuring Reflections and Scattered Light

Figure 24:
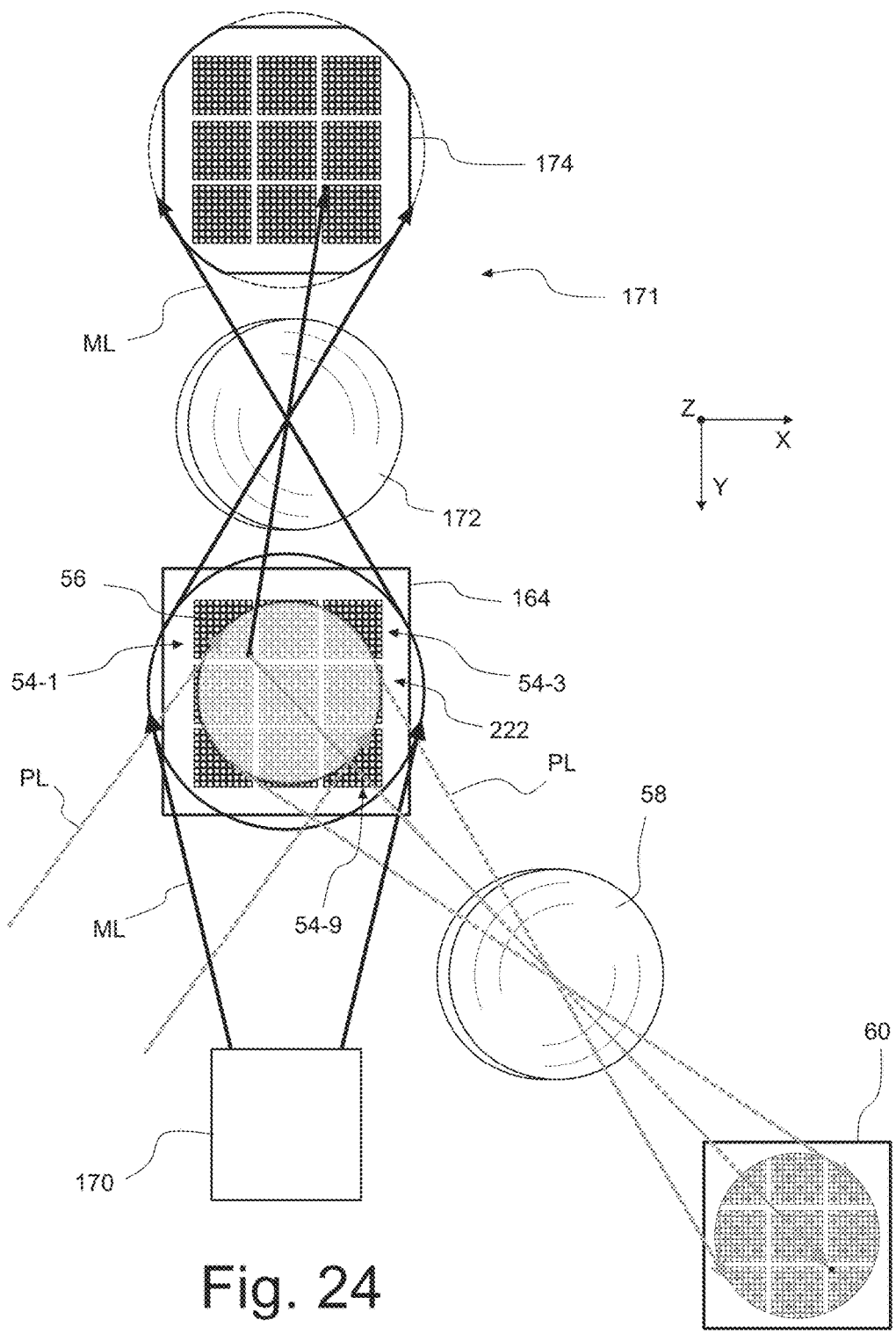
FIG. 24 is a perspective schematic view on a measuring device according to an embodiment in which a camera detects measuring light that has been reflected or scattered from the micromirrors or structures between the micromirrors.

FIG. 24 illustrates a different approach for in measuring the position and also the orientation of the micromirrors 56. According to this approach, measuring light that is distinct from the projection light and has been reflected or scattered from the spatial light modulator 52 is detected.

Similar to the embodiment shown in FIG. 23, the spatial light modulator 52 includes a board 164 that supports nine micromirror arrays 54-1 to 54-9 that are spaced apart by gaps and define the modulation surface 222. The latter is imaged by the first objective 58 on the optical integrator 60. Grey dotted lines represent the projection light PL that first impinges on the spatial light modulator 52 and is then reflected by those micromirrors 56 being in the "on" state towards the first objective 58 and the optical integrator 60.

The measuring device 150 in this embodiment includes a measuring light source 170 which directs measuring light ML on the spatial light modulator 52. The measuring light ML is reflected, either from the micromirrors 56 that are in the "on" or from the micromirrors 56 that are in the "off" state, towards a camera 171 that is configured to observe the modulation surface 222 of the spatial light modulator 52. The camera 171 detects light that has been reflected or scattered by the micromirrors 56 or by structures in the gaps between the micromirrors 56. The camera 171 includes an objective 172 and a position resolving light detector 174 on which an image of the modulation surface 222 is formed.

In order to avoid that the measuring light ML reaches the optical integrator 60, the projection light PL impinges on the spatial light modulator 52 basically parallel to an XZ plane, whereas the measuring light ML impinges on the spatial light modulator 52 basically parallel to an orthogonal YZ plane.

From the location of the images of the micromirrors 56 on the position resolving light detector 174 it is possible to detect whether the board 164 that supports the micromirrors 56 has drifted, and also to quantitatively determine the amount of the drift movement. It is even possible to detect relative drift movements between adjacent micromirrors arrays 54.

The camera 171 may also detect the orientation of the mirror surfaces of the micromirrors 56. Preferably the measuring light ML is reflected towards the camera 171 by micromirrors 56 that are either in the "on" or the "off" position. Even if the measuring light ML is not directly reflected towards the camera 171 in any of the orientations of the mirror surfaces, the position resolving light detector 172 may detect some of the light that has been scattered by the micromirrors 56 or by structures arranged on the board 164 between the mirror surfaces.

It may also be envisaged to illuminate the spatial light modulators from different directions with measuring light ML. For example, the measuring light source 170 may be fixed on a curved rail so that it can be guided around the spatial light modulator 52, or a plurality of measuring light sources 170 may be arranged at different positions with regard to the spatial light modulator 52.

5. Compensation of Drift Movements

In the foregoing it has been described in detail how relative drift movements between the spatial light modulator 52 and the optical integrator 60 can be measured. In the following it will be described how the control of the spatial light modulator 52 may be modified for compensating the adverse effects associated with the measured drift movements.

FIG. 25A is a schematic top view similar to FIG. 11A on the modulation surface 222 of the micromirror array 54 of the spatial light modulator 52. Here it is assumed that the micromirror 56d shall be in an "off" state so that the image area 226-4 in the illumination field 14 receives less light from pole 27 than from pole 27', as this is shown in FIG. 25B.

FIGS. 26A and 26B illustrate the same situation after the micromirror array 54 has been displaced as a result of a thermal drift movement by a distance d along the +X direction. The distance d is again assumed to be equal to the width of one micromirror 56.

The position of the poles 27, 27' in absolute terms does not change, but relative to the micromirror array 54 the poles 27, 27' shift by the width of one micromirror 56 towards the −X direction. Since the imaging on the optical integrator 60 is not affected by the shift of the micromirror array 54, different groups of micromirrors 56 will be imaged on the light entrance facets 75. The grid G represents the borderlines of the object areas 110 on the micromirror array 54. It can be seen that the micromirror 56d being in the "off" state is now centered in an object area 110. Consequently, the position in the illuminated field 14 where less projection light is received from the pole 27 than from the pole 27', has changed to the image area 226-5, as this is shown in FIG. 26B. Since the position of the poles 27a, 27b relative to the optical integrator 60 has not changed, the angular irradiance distribution is not affected otherwise.

From FIG. 26A it becomes clear how an inadvertent change of the field dependency can be compensated. It is only desirable to control the micromirror array 54 such that not the micromirror 56d, but the micromirror 56d', which is the next micromirror adjoining the micromirror 56d along the −X direction, is brought into the "off" state. Then the same situation is obtained as shown in FIGS. 25A and 25B.

This simple example demonstrates that almost any arbitrary relative drift movements between the spatial light modulator 52 and the optical integrator 60 can be compensated for by an appropriate control of the micromirrors 56 of the spatial light modulator 52. Even if the spatial light modulator 52 is not displaced by a distance d or an integer multiple thereof, a modified control of the micromirrors 56 makes it usually possible to reduce adverse effects associated with drift movements to a minimum.

VI. EUV

In the foregoing the disclosure has been described with reference to the projection exposure apparatus 10 which uses VUV projection light. However, it is also possible to use the concepts outlined above in EUV projection apparatus.

WO 2009/100856 A1 describes an EUV illumination system which makes it possible to produce a desired field dependency of the irradiance and the angular irradiance distribution. Also in that case small mirrors have to be controlled individually in order to achieve the desired field dependencies.

VII. Important Method Steps

Figure 27:
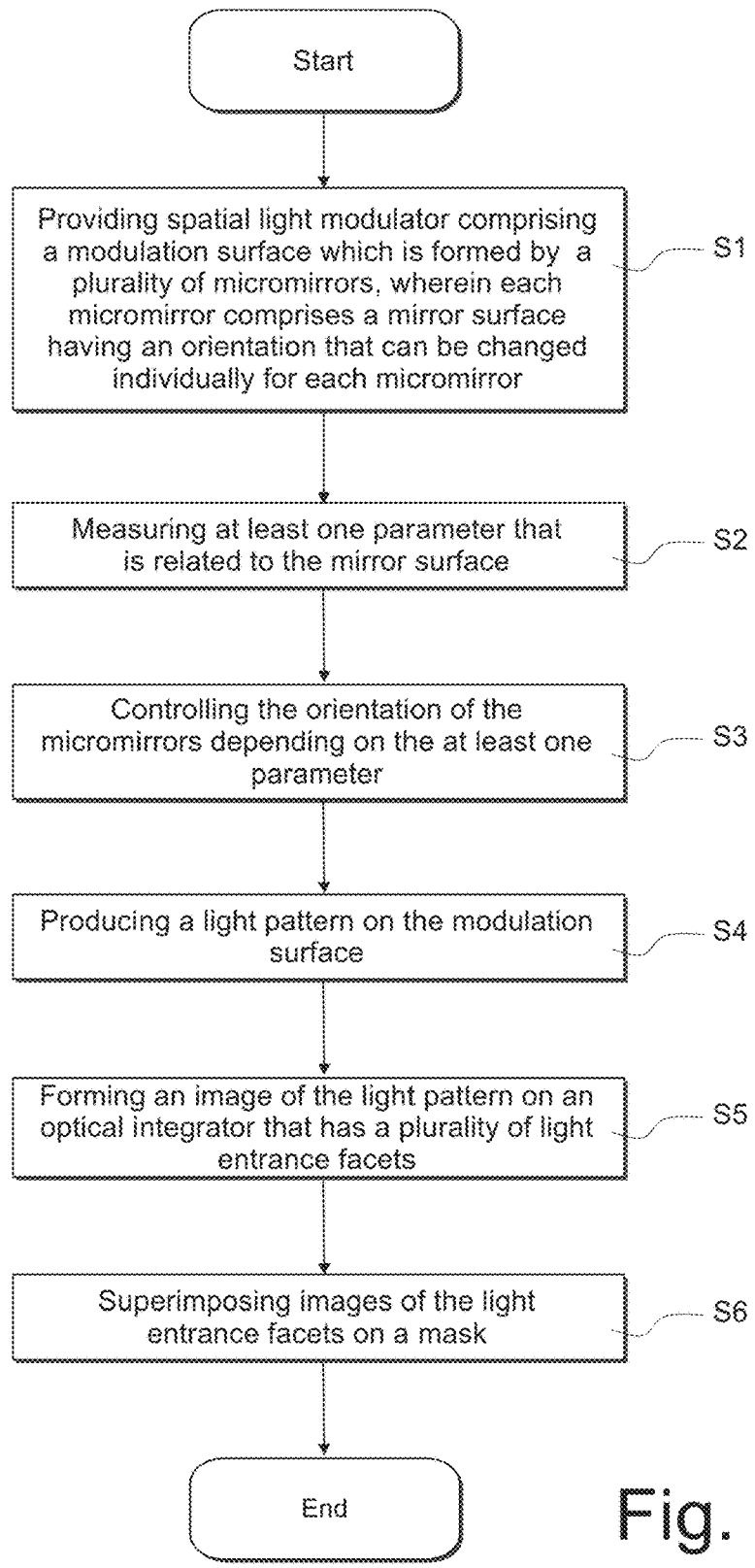
FIG. 27 is a flow diagram of a method in accordance with the present disclosure.

Important method steps of the present disclosure will now be summarized with reference to the flow diagram shown in FIG. 27.

In a first step S1 a spatial light modulator is provided that includes a modulation surface which is formed by a plurality of micromirrors. Each micromirror includes a mirror surface having an orientation that can be changed individually for each micromirror.

In a second step S2 at least one parameter that is related to the mirror surface is measured.

In a third step S3 the orientation of the micromirrors is controlled depending on the at least one parameter.

In a fourth step S4 a light pattern on the modulation surface is produced.

In a fifth step S5 an image of the light pattern is formed on an optical integrator that has a plurality of light entrance facets.

In a sixth step S6 images of the light entrance facets are superimposed on a mask.

What is claimed is:

1. A method of operating an illumination system of a microlithographic projection apparatus, the illumination system comprising a spatial light modulator comprising a modulation surface comprising a plurality of micromirrors arranged in a modulation plane, each micromirror comprising a mirror surface having an individually changeable orientation, the method comprising:
   for at least one of the micromirrors, measuring a parameter related to the mirror surface to provide a measured parameter;
   controlling the orientation of the mirror surface depending on the measured parameter;
   producing a light pattern on the modulation surface;
   forming an image of the light pattern on a raster field plane of an optical integrator comprising a plurality of light entrance facets arranged in the raster field plane, the raster field plane being optically conjugate to the modulation plane; and
   superimposing images of the light entrance facets on a mask.

2. The method of claim 1, wherein the measured parameter is selected from the group consisting of a position of the mirror surface and an orientation of the mirror surface.

3. The method of claim 1, wherein measuring the parameter comprises measuring an angular irradiance distribution at least at one field point in a mask plane or a plane that is optically conjugate to the mask plane.

4. The method of claim 3, wherein the measured parameter comprises the orientation of the mirror surface, and the method comprises measuring the angular irradiance distribution at a plurality of field points in the mask plane or a plane that is optically conjugate to the mask plane.

5. The method of claim 4, comprising simultaneously measuring the angular irradiance distribution at the plurality of field points.

6. The method of claim 5, wherein the illumination system comprises a plurality of position resolving light sensors arranged at positions that are associated with the plurality of field points, and the method comprises using each light sensor to measure the angular irradiance distribution for the associated field point.

7. The method of claim 1, wherein measuring the parameter comprises measuring an irradiance at least at one field point in a mask plane or a plane that is optically conjugate to the mask plane.

8. The method of claim 7, wherein the measured parameter is the orientation of the mirror surface, and the method comprises measuring irradiance at a plurality of field points in the mask plane or a plane that is optically conjugate to the mask plane.

9. The method of claim 1, wherein measuring the parameter comprises computing the based on a shape of the mirror surfaces, a spatial arrangement of the modulation surface relative to the light entrance facets, and a shape of the light entrance facets.

10. The method of claim 1, wherein the parameter is measured while controlling the orientations of the mirror surfaces so that adjacent mirror surfaces do not superimpose light on the mask.

11. The method of claim 1, wherein the parameter is measured while detecting a position of a marker point that is fixedly arranged with respect to the spatial light modulator.

12. The method of claim 1, wherein the modulation surface is observed by a camera which detects light that has been reflected or scattered by the micromirrors or by structures between the micromirrors.

13. The method of claim 1, wherein controlling the orientation of the mirror surface comprises laterally shifting a control pattern when the mirror surface has been measured as being laterally displaced.

14. A method of operating an illumination system of a microlithographic projection apparatus comprising a spatial light modulator comprising a modulation surface comprising a plurality of micromirrors arranged in a modulation plane, each micromirror comprising a mirror surface having an individually changeable orientation, the method comprising:
   for at least one of the micromirrors, measuring a parameter related to the mirror surface to provide a measured parameter;
   controlling the orientation of the mirror surface depending on the measured parameter;
   producing a light pattern on the modulation surface; and
   forming an image of the light pattern on a field plane which is optically conjugate to the modulation plane.

15. An illumination system, comprising:
   a spatial light modulator comprising a modulation surface which comprises a plurality of micromirrors arranged in a modulation plane, each micromirror comprising a mirror surface having an individually changeable orientation;
   a measuring device configured to measure, for at least one of the micromirrors, a parameter that is related to the mirror surface to provide a measured parameter;
   a control unit configured to control the orientation of the micromirrors depending on the measured parameter;
   an optical integrator comprising a plurality of light entrance facets arranged in a raster field plane which is optically conjugate to the modulation plane; and
   an imaging optical system configured to provide an image of the modulation surface on the raster field plane.

16. An illumination system, comprising:
a spatial light modulator comprising a modulation surface comprising a plurality of micromirrors arranged in a modulation plane, each micro-mirror comprising a mirror surface having an individually changeable orientation;
a measuring device configured to measure, for at least one of the micromirrors, a parameter related to the mirror surface to provide a measured parameter;
a control unit configured to control the orientation of the micromirrors depending on the measured parameter; and
an imaging optical system configured to form an image of the modulation surface on a field plane that is optically conjugate to the modulation plane.

17. The illumination system of claim 16, further comprising a pupil forming unit which comprises a mirror array comprising a plurality of mirrors, wherein, for each mirror of the mirror array of the pupil forming unit, the mirror is configured to illuminate a spot on the modulation plane at a position that is variable by changing a deflection angle produced by the mirror.

18. The illumination system of claim 15, further comprising a pupil forming unit which comprises a mirror array comprising a plurality of mirrors, wherein, for each mirror of the mirror array of the pupil forming unit, the mirror is configured to illuminate a spot on the modulation plane at a position that is variable by changing a deflection angle produced by the mirror.

19. The method of claim 14, wherein the method comprises imaging the mirror surface of each micromirror onto the raster field plane.

20. The method of claim 14, wherein:
the illumination system further comprises a pupil forming unit which comprises a mirror array comprising a plurality of mirrors; and
the method further comprises illuminating a spot on the modulation plane at a position that is variable by changing a deflection angle produced by a mirror of the pupil forming unit.

21. The method of claim 1, wherein the method comprises imaging the mirror surface of each micromirror onto the raster field plane.

22. The method of claim 1, wherein:
the illumination system further comprises a pupil forming unit which comprises a mirror array comprising a plurality of mirrors; and
the method further comprises illuminating a spot on the modulation plane at a position that is variable by changing a deflection angle produced by a mirror of the pupil forming unit.

* * * * *

UNITED STATES PATENT AND TRADEMARK OFFICE
CERTIFICATE OF CORRECTION

Page 1 of 1

PATENT NO. : 10,444,631 B2
APPLICATION NO. : 15/899521
DATED : October 15, 2019
INVENTOR(S) : Markus Deguenther et al.

It is certified that error appears in the above-identified patent and that said Letters Patent is hereby corrected as shown below:

In the Specification

Column 4, Line 39, delete "facets," and insert -- facets. --;

Column 12, Line 30, delete "FIG." and insert -- FIGS. --;

Column 14, Line 22, after "less" delete "to"; and

In the Claims

Column 30, Line 17, Claim 9, after "computing the" insert -- parameter --.

Signed and Sealed this
Fifth Day of May, 2020

Andrei Iancu
*Director of the United States Patent and Trademark Office*